United States Patent
Shibahara et al.

(10) Patent No.: US 8,638,026 B2
(45) Date of Patent: Jan. 28, 2014

(54) STAGE DRIVE DEVICE

(75) Inventors: Masashi Shibahara, Hitachinaka (JP);
Mikio Tokuyama, Tsuchiura (JP);
Koichiro Takeuchi, Hitachinaka (JP);
Shigeru Haneda, Hitachinaka (JP);
Osamu Yamada, Hitachinaka (JP);
Naoki Sakamoto, Hitachinaka (JP);
Eiichi Hazaki, Tsuchiura (JP); Akito Tanokuchi, Hitachinaka (JP)

(73) Assignee: Hitachi High-Technologies Corporation, Tokyo (JP)

( * ) Notice: Subject to any disclaimer, the term of this patent is extended or adjusted under 35 U.S.C. 154(b) by 63 days.

(21) Appl. No.: 13/123,199

(22) PCT Filed: Oct. 6, 2009

(86) PCT No.: PCT/JP2009/067417
§ 371 (c)(1),
(2), (4) Date: Jul. 6, 2011

(87) PCT Pub. No.: WO2010/041663
PCT Pub. Date: Apr. 15, 2010

(65) Prior Publication Data
US 2011/0260558 A1 Oct. 27, 2011

(30) Foreign Application Priority Data

Oct. 8, 2008 (JP) .................. 2008-261199
Mar. 6, 2009 (JP) .................. 2009-052795

(51) Int. Cl.
*H01L 41/08* (2006.01)
(52) U.S. Cl.
USPC ............................................ 310/328

(58) Field of Classification Search
USPC ............ 310/323.02, 323.07, 323.01, 323.08, 310/328, 323.17, 12, 14, 12.06, 12.07
IPC ......................................................... H01L 41/08
See application file for complete search history.

(56) References Cited

U.S. PATENT DOCUMENTS 4,607,166 A 8/1986 Tamaki
4,723,086 A * 2/1988 Leibovich et al. ............ 310/328

(Continued)

FOREIGN PATENT DOCUMENTS

JP 2001-337186 A 12/2001
JP 2003-243282 A 8/2003

(Continued)

OTHER PUBLICATIONS

Office Action issued Apr. 30, 2012, in German Patent Application No. 11 2009 002 442.4.

*Primary Examiner* — Thomas Dougherty
*Assistant Examiner* — Karen B Addison
(74) *Attorney, Agent, or Firm* — Miles & Stockbridge P.C.

(57) ABSTRACT

A stage comprises a linear guide rail (2) for guiding a movable table (4), a driven bar (12), a linear drive actuator in contact with the driven bar (12) to transmit driving force to the driven bar (12), and parallel plate springs (30) for holding opposite ends of the driven bar (12). A drive transmitting surface of the linear drive actuator is provided so as to be separated from the movable table (4), and this prevents the accuracy of positioning from being reduced. Also, the parallel springs (30) reduce deforming forces applied to sections supporting the driven bar (12), and this prevents the driven bar from being damaged. The configuration makes the stage highly accurate and highly reliable.

17 Claims, 18 Drawing Sheets

(56) References Cited

U.S. PATENT DOCUMENTS

| | | |
|---|---|---|
| 5,760,564 A | 6/1998 | Novak |
| 6,252,333 B1 * | 6/2001 | Iino et al. .................. 310/323.17 |
| 6,873,404 B2 * | 3/2005 | Korenaga ........................ 355/72 |
| 6,917,046 B2 * | 7/2005 | Korenaga ................... 250/492.2 |
| 2003/0034695 A1 * | 2/2003 | Binnard et al. ................. 310/12 |
| 2005/0189901 A1 | 9/2005 | Tanaka |
| 2008/0211349 A1 * | 9/2008 | Seya et al. ................ 310/323.02 |

FOREIGN PATENT DOCUMENTS

| | | |
|---|---|---|
| JP | 2003-284361 A | 10/2003 |
| JP | 2007-043779 A | 2/2007 |
| JP | 2007-324045 A | 12/2007 |
| WO | WO-2006/132111 A1 | 12/2006 |

* cited by examiner

STAGE DRIVE DEVICE

CROSS REFERENCE

The present application claims the priority rights based upon Japanese Patent Application No. 2008-261199 filed on Oct. 8, 2008 and Japanese Patent Application No. 2009-052795 filed on Mar. 6, 2009, the contents of which constitute in part the specification in the present application by reference.

TECHNICAL FIELD

The present invention relates to a stage drive device, and in particular to a positioning device for driving a stage with the use of a linear drive actuator, and as well to a method of holding the linear drive actuator.

BACKGROUND ART

There has been needed a positioning device (stage) provided in a scanning electron microscope (SEM), for carrying thereon a sample, which requires a high degree of positioning accuracy in order to make precise observation of the sample. For example, in a SEM adapted to inspect a semiconductor wafer, the wafer is fixed on a stage which is arranged precisely at the position of observation in the electronic microscope so as to acquire an image of the wafer. At this stage, should the stage be positioned with errors, the position of observation by the electron microscope would be deviated. As a result, there have been desired a positioning device and a drive unit therefor, which are capable of positioning the stage with a high degree of accuracy.

Heretofore, there has been broadly used a positioning device in which a ball screw is rotated by a stepping motor so as to cause a nut mounted on the ball screw to displace a stage (which will be hereinafter referred to as "ball nut type").

As to another type, instead of a conventional stepping motor, there has been a direct drive type positioning device in which an ultrasonic motor composed of a piezoelectric element (electrostrictive element) is attached directly to the side surface of the stage in order to directly displace the latter. Patent Document 1 discloses a drive system in which a piezoelectric element is pressed against a drive transmission surface attached to the side surface of the stage, and accordingly, the stage is rectilinearly moved in the direction of displacement of the stage with the use of the shearing deformation of the piezoelectric element applied thereto with a power voltage in order to displace the stage.

Prior Art Documents

Patent Document 1: JP-A-2007-43779

SUMMARY OF THE INVENTION

The Problems to be Solved by the Invention

In the case of the positioning device of the ball nut type, errors in the engagement between the ball screw and the nut, elastic deformation of the ball screw, errors in revolution of the stepping motor or the like cause occurrence of the so-called backlash just after the time when the displacement direction of the stage is reversed, that is, the stage is stand still in response to an instruction for displacement thereof, or is displaced slightly if it can, so that its displacement is smaller than the value by the instruction. As a result, there has been presented one of causes which hinder the positioning of the stage with a high degree of accuracy.

Further, in the method disclosed in Patent Document 1, the drive force is transmitted, direct to the stage with no used of the ball screw and the nut, and according, there can be prevented occurrence of any lash (play) between the ball screw and the nut or any deformation of the ball screw, and further, there can be also prevented occurrence of any play in the stepping motor, thereby it is possible to expect the advantage that the backlash can be reduced. However, the following problems are inherent.

In the method disclosed in Patent Document 1, the piezoelectric element is pressed against the drive transmission surface which is provided to a side surface of the stage in order to transmit a drive force caused by the shearing deformation of the piezoelectric element, to the stage with the use of a friction force between the piezoelectric element and the drive transmission surface. The searing deformation force of the piezoelectric element is strong, and accordingly, the thrust force F of the stage can be exhibited by the product of the pressing force N of the piezoelectric element against the drive transmission surface, and the frictional coefficient $\mu$ between therebetween.

$$F = \mu N \quad (1)$$

In order to enhance the thrust force F of the stage, should the pressing force N be increased, there would be caused the problem that the stage is deformed being pressed by the strong force. Further, since the force is applied thereto, perpendicular to a linear guide rail for guiding the displacement of the stage, errors in the positioning of the stage would be caused since the guide rail is deformed and so forth. Further, in order to increase the drive range (stroke) of the stage, it is required to increase (prolong) the drive transmission surface, that is, it is required to increase the stage itself. The larger the stage, the larger the mass of the stage is inevitabe, and accordingly, there have been caused lowering of the displacement side, increased power consumption, a longer time required for the positioning of the stage and the like.

In view of the above-mentioned problems, an object of the present invention is to provide a stage drive device capable of positioning a stage with a high degree of accuracy.

Measures to Solve the Problems

According to the present invention, there is provided the configuration that piezoelectric element is used for the displacement of the stage, while a drive transmission surface is provided being separated from the stage. With the use of an actuator formed of the piezoelectric element, the stage is displaced.

Thus, according to the present invention, the backlash can be reduced, thereby it is possible to materialize the positioning of the stage with a high degree of accuracy. Further, with the provision of the drive transmission surface separated from the stage, it is possible to prevent the stage and like from being deformed, thereby it is possible to enhance the positioning accuracy of the stage. Further, since the drive transmission surface is provided, being separated from the stage, the stroke of the stage can be increased without increasing the stage itself.

The other objects, features and advantages of the present invention will be apparent from the description of embodiments of the present invention which will be described hereinbelow with reference to the accompanying drawings in which:

MODE FOR CARRYING OUT THE INVENTION

Next, brief explanation will be made of the present invention, and then, detailed explanation will be made of the specific embodiments of the present invention.

In order to solve the above-mentioned problems, it is required (1) to reduce backlash, (2) to prevent the positioning accuracy from being lowered due to deformation of a stage or the like by a piezoelectric element motor, and (3) to enlarge the stroke without making the stage itself larger.

According to the present invention, with the use of a piezoelectric element for driving the stage, the backlash is reduced, thereby it is possible to materialize a high degree of positioning accuracy.

Figure 7A:
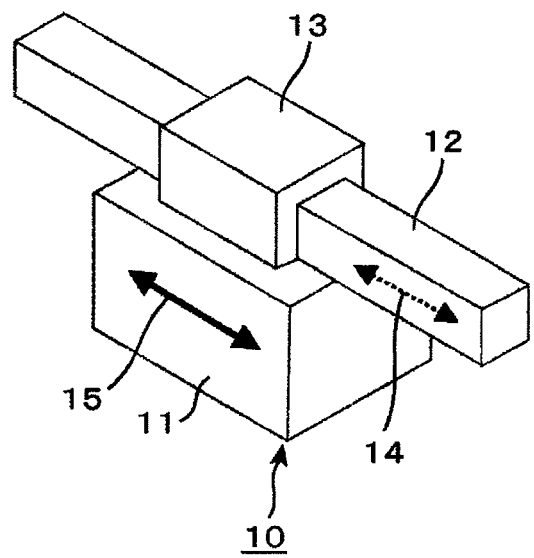
FIG. 7A is a perspective view illustrating a linear drive actuator.

Further, a drive transmission surface is provided to be separated from the stage. As shown in FIG. 7A, an actuator 10 is comprised of a piezoelectric element (which is not shown) which is incorporated in an actuator body 11 thereof, a drive bar 12 made into contact with the piezoelectric element so as to be rectilinearly driven, and a cover 13 for pressing the driven bar 12 against the piezoelectric element and regulating (guiding) the direction of movement thereof. It is noted here that the drive bar 12 itself constitutes the drive transmission surface. The actuator 10 is realized, fop example, by a linear drive actuator in its specific form, for applying a drive force in parallel with the driven bar 12.

The above-mentioned actuator can be used without the necessity of pressing the piezoelectric element against the side surface of the stage, thereby it is possible to prevent deformation of the stage, and accordingly, the degree of the positioning accuracy thereof can be enhanced. Specifically, in order to increase the thrust force F for the stage, the force N of the resilient member (for example, a spring 9) which press the driven bar 12 against the piezoelectric element (which is not shown) in the actuator 11 may be increased.

Figure 7B:
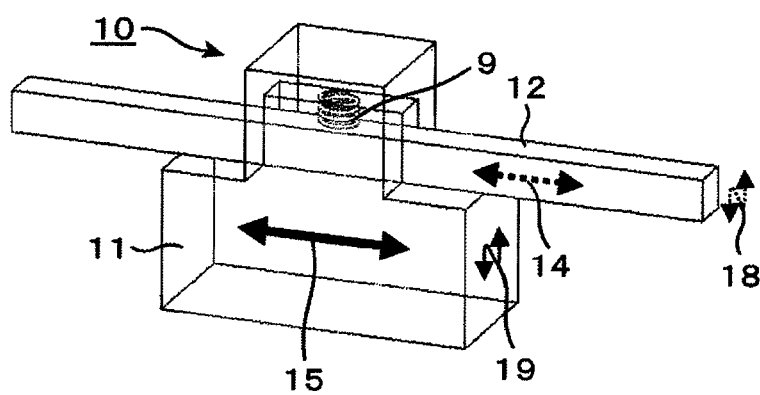
FIG. 7B is a perspective view illustrating a linear drive actuator.

As shown in FIG. 7B, the actuator 10 is composed of the piezoelectric element (which is not shown) which is incorporated in the actuator body 11, and is also composed of the driven bar 2 which is made into contact with the piezoelectric element so as to be rectilinearly driven, and a spring 9 for pressing the driven bar 12 against the piezoelectric element. It is noted here that the driven bar itself serves as the drive transmission surface.

With the use of the above-mentioned actuator, there can be eliminated the necessity of pressing the piezoelectric element against a side surface of the stage, and accordingly, it is possible to prevent the stage or the like from being so deformed as to lower the degree of positioning accuracy thereof. In order to enhance the thrust force F, the pressing force of the spring 9 may be increased.

Further, by increasing the length of the driven bar 12, the stroke of the stage can be prolonged unlimitedly in principle. Referring to FIG. 7B, the moving direction of the driven bar 12, when the actuator body 11 is fixed, is indicated by the arrow 14. Meanwhile, the moving direction of the actuator body, when the driven bar 12 is fixed at its opposite ends, is indicated by the arrow 15.

The linear drive actuator with the use of the piezoelectric element is not the one in which an armature such as an electromagnetic linear motor and a stator are driven in a noncontact manner, but the one in which the armature and the stator are driven, both being made into contact with each other. In order to apply the contact force therebetween, the pressing spring 9 constitutes, as one of necessary component parts, the linear drive actuator.

Figure 7C:
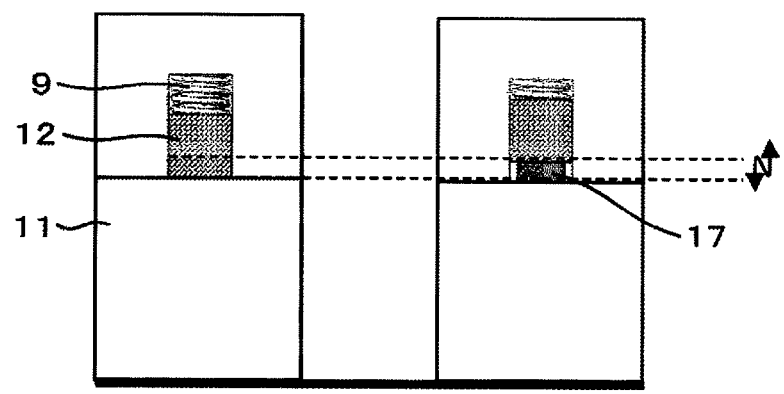
FIG. 7C is a view for explaining the linear drive actuator.

As shown in FIG. 7C, in the case of the actuator body 11 serving as the stator while the driven bas 12 serves as the armature, when the actuator is driven, the driven bar 12 is pushed up in response to the extension and contraction of the piezoelectric element 17, and accordingly, the driven bar 12 is moved in the direction indicated by the arrow 14 while the driven bar 12 is vibrated in a direction of the arrow 18 which is perpendicular to the travelling direction.

Figure 7D:
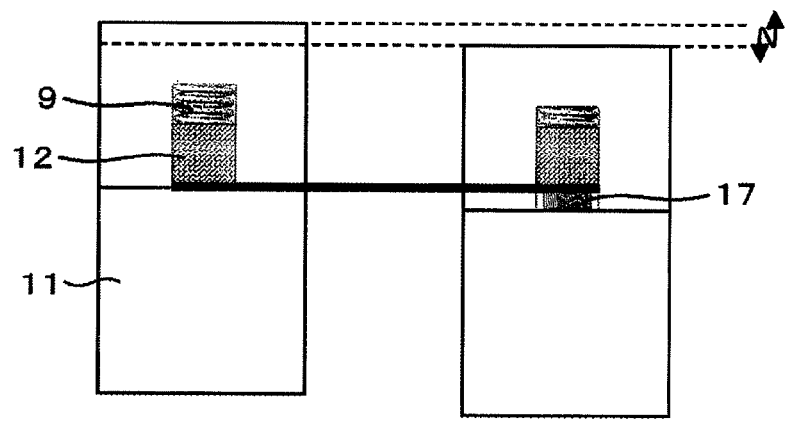
FIG. 7D is a view for explaining the linear drive actuator.

On the other hand, in the case of the driven bas 12 serving as the stator while the actuator body 11 serves as the armature as shown in FIG. 7D, when the actuator is driven, the actuator body 11 is moved in the direction indicated by the arrow 15 in response to the extension and retraction of the piezoelectric element 17 while the actuator body 11 is vibrated in the direction indicated by the arrow 19.

The linear drive actuator having the piezoelectric element as stated above, has the driving characteristics that it is moved while it is vibrated. Thus, there is raised the problem of how to use the linear drive actuator as a driving means (motor) for the stage, that is, how to mount the linear actuator (that is, the measures and the method thereof).

Thus, the explanation will be made of the mounting of the actuator.

Since the stage is displaced along (guided by) the guide rails 2, it is necessary to mount the actuator in such a way that the drive force thereof is set in a direction in parallel with that of the guide rails 2. That is, it is necessary to mount the driven bar 12 on which the actuator is mounted, in a direction in parallel with the guide rails.

It is then noted that the driven bar 12 is made of ceramics or the like so as to be rigid with the purpose of ensuring the durability thereof and the degree of positioning accuracy.

However, in view of the drive characteristics of the linear drive actuator, the body 11 of the linear drive actuator and the driven bar 12 cannot be completely constrained. It is because should they be completely constrained, there could not be presented the extension margin for expansion and contraction of the piezoelectric element 17, resulting in the impossibility of driving the actuator. Thus, either one of them has a movable mechanism. For example, in the case of rigidly coupling the stage upper part (movable table) and the linear drive actuator body 11 together, the attachment distance therebetween is determined by the length of an actuator fixing member so as to become constant, and accordingly, the driven bar of the linear drive actuator is mounted in parallel with the linear guide rails for the stage, and further, is constrained by the mechanism that is movable in a direction perpendicular to the linear guide rails. Further, by using this mechanism, there may be exhibited by such technical effects and advantages that the stage can be positioned at a high speed with a high degree of positioning accuracy even though the parallelism between the direction of the drive force and the guide rails is not exact.

Specifically, when the stage is displaced, the stage tends to displace along the guide rails while the actuator body 11 mounted to the stage tends to move along the driven bar 12, and accordingly, the distance therebetween tends to vary. However, as stated above, the distance therebetween is maintained to be constant, and accordingly, the force (deformation force) adapted to maintain the distance to be constant is exerted to the driven bar and the stage. This force is effected in a direction perpendicular to the traveling direction of the stage so as to hinder the smooth displacement of the stage. Should the parallelism between both members (the driven bar and the guide rails) be remarkably inferior, both members would be damaged with a high degree of possibility. Thus, with the use of the mechanism which is movable in a direction perpendicular to the guide rails, the above-mentioned problem can be avoided.

Meanwhile, it is difficult to mount the driven bar of the linear drive actuator on the stage so as to allow the driven bar to extend in a direction which is strictly parallel with the guide rails in view of the problems caused by manufacturing and assembling tolerances.

Thus, it is necessary to mount the linear drive actuator on the stage so as to allow the drive force of the linear drive actuator to be effective along the guide rails when the stage is driven in order to prevent the drive characteristics of the linear drive actuator from being hindered even though the manufacturing and assembling errors exist.

According to the present invention, in the linear drive actuator as shown in FIGS. 7A to 7D, the driven bar is mounted by means of a spring mechanism so as to be (substantially) in parallel with the linear guide rails for the stages. Specifically, the stage upper part (movable table) is coupled thereto with the actuator body so as to support the driven bar in parallel with the guide rails. Further, the driven bar is gripped at its opposite ends by one end of the springs the other end of which is connected to the stage lower part (a stationary part or a base) that is attached to the guide rails.

Even though the driven bar of the linear actuator and the guide rails cannot be assembled in parallel with each other due to manufacturing and assembling errors, with the use of the above-mentioned configuration which utilizes the spring mechanism (for example, parallel leaf springs) as stated above, each leaf spring mechanism is deformed so as to absorb a deviation (error) from the parallelism therebetween when the stage is displaced being guided by the guide rails, in order to prevent the guide rails or the driven bar from being broken, thereby it is possible to carry out the positioning of the stage with a high degree of accuracy and with a high degree of reliability.

Further, contrarily, in the linear drive actuator shown in FIG. 7, in which the drive bar is coupled rigidly to the guide rails in parallel with each other, the actuator body is mounted by means of the spring mechanism. Specifically, the stage lower part (a stationary part or a base) and the driven bar are rigidly connected to the guide rail, and the actuator body is supported to the stage upper part by means of the spring mechanisms (such as leaf springs). It is noted here that the leaf springs serving as the spring mechanisms as stated above have the configuration that they are attached in parallel with the longitudinal direction of the actuator body, and accordingly, the leaf springs are rigid in the travelling direction of the actuator body, but is soft so as to be easily deformed in a direction perpendicular to the travelling direction.

Thus, as stated above, the drive characteristics that the linear drive actuator is moved for driving the stage while it vibrates in a direction perpendicular to the travelling direction thereof is not hindered, and further, even though the driven bar and the guide rails are assembled being not in parallel with each other due to manufacturing and assembling errors or the like, the spring mechanism deforms so as to absorb a deviation (error) from the parallelism therebetween, thereby it is possible to carry out the positioning of the stage with a high degree of accuracy and with a high degree of reliability.

Explanation will be hereinbelow made of a preferred embodiment of the present invention with reference to the accompanying drawings. FIGS. 1 to 4 shows an embodiment of the positioning device incorporating an actuator.

Figure 1:
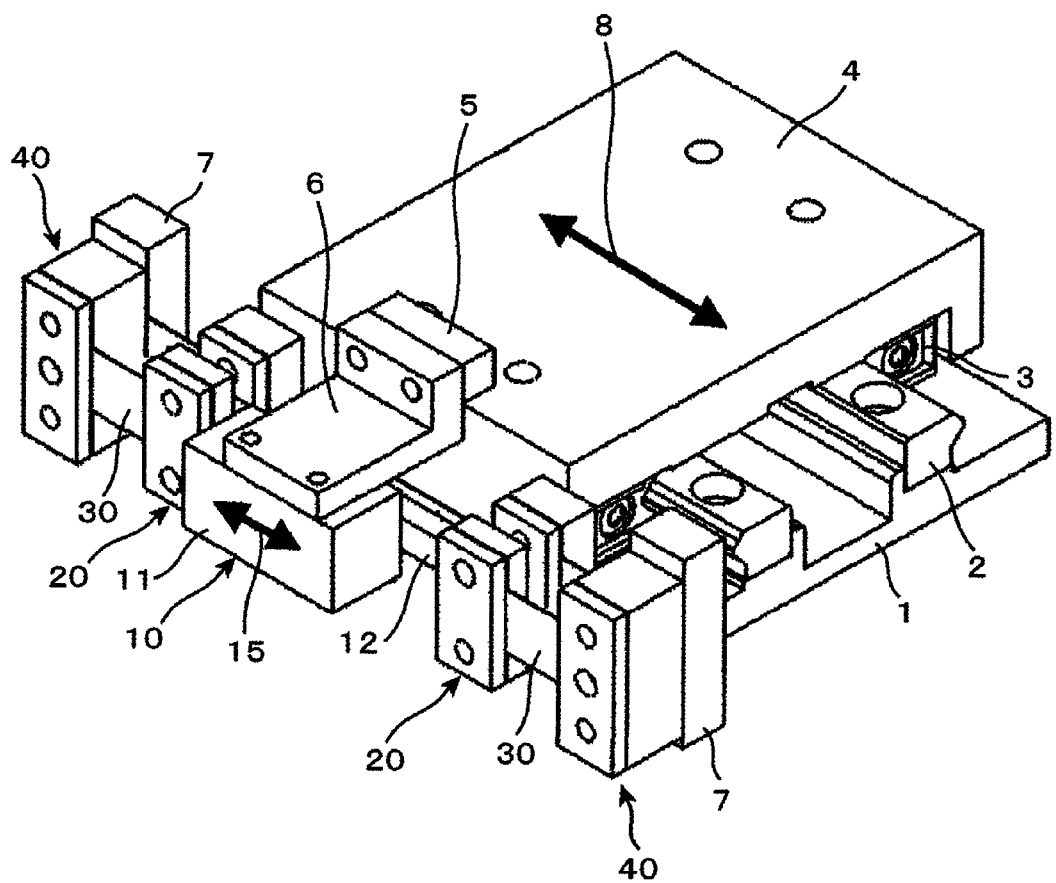
FIG. 1 is a perspective view illustrating a first embodiment.

The positioning device shown in FIG. 1 incorporates a pair of guide rails 2 which are laid on a stage lower part 1, and a stage upper part 4 serving as a movable member, which is rectilinearly guided by the guide rails 2 through the intermediary of guides 3. The stage upper part 4 is displaced in a direction indicated by the arrow 8, that is, in the stage displacement direction. An actuator 10 is mounted to one side surface of the stage upper part 4, that is, an actuator body 11 is held thereto by an actuator fixing member 6 through the intermediary of an attachment portion 5. The actuator 10 is materialized by, for example, a linear drive actuator having a drive force which is parallel with the driven bar or the guide rails 2.

The driven bar 12 of the actuator 10 is coupled at its opposite ends to one end of parallel leaf springs 30 by screws through the intermediary of co-fastening portions 20, respectively.

In this embodiment, parallel leaf springs are used as the above-mentioned springs. The parallel leaf springs are attached in parallel with the longitudinal direction of the driven bar. Thus, the parallel leaf springs are rigid in the travelling direction of the driven bar but are soft so as to be readily deformed in a direction perpendicular to the traveling direction. The parallel leaf springs 30 are formed of thin metal sheets made of phosphor bronze in this embodiment. Since the phosphor bronze has a high shear resistivity, and accordingly, it is appropriate for the parallel leaf springs.

With the use of the above-mentioned parallel leaf springs, the drive characteristics that the linear drive actuator is moved for driving the stage while it is vibrated in a direction perpendicular to the traveling direction thereof, is not hindered. Further, even though the driven bar of the linear drive actuator and the guide rails are assembled not in parallel with each other due to manufacturing and assembling errors or the like, the leaf springs used as mentioned above are deformed to absorb a deviation (error) from the parallelism therebetween so as to carry out the positioning of the stage with a high degree of accuracy and with a high degree of reliability, when the stage upper part is displaced by being guided on the guide rails.

It is noted that the parallel leaf springs are rigid in the longitudinal direction of the driven bar, and accordingly, the drive force of the actuator body in the travelling direction is never lowered.

The parallel leaf springs 30 are attached at their the other end to attachment portions 7 by screws through the intermediary of parallel spring gripping portions 40. It is noted that the screws are not shown. Further, the attachment portions 7 are integrally incorporated with the stage lower part 1. Since the actuator body 11 of the actuator 10 is fixed to the stage upper part 4, and since the driven bar 12 is fixed at its opposite ends to the attachment portions 7 which is integrally incorporated with the stage lower part 1, the actuator body 11 in this embodiment is moved in the direction of the arrow 15 in order to displace the stage upper part 4 in the direction of the arrow 8. It is noted here that the structures which includes the co-fastening portions 20, the parallel leaf sprigs 30, the parallel leaf spring gripping portions 40 and the attachment portions 7, and which are located at the opposite ends of the driven bar 12 have the same structure.

Figure 2:
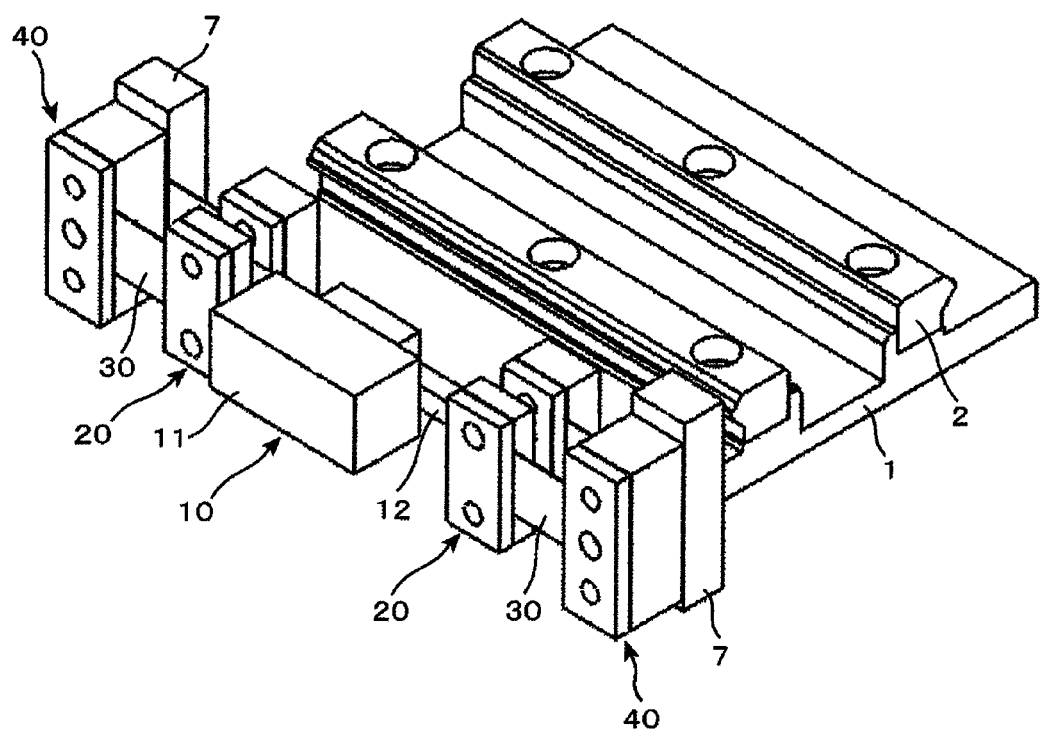
FIG. 2 is a view illustrating a stage in the first embodiment, with the top part thereof being removed.
Figure 3:
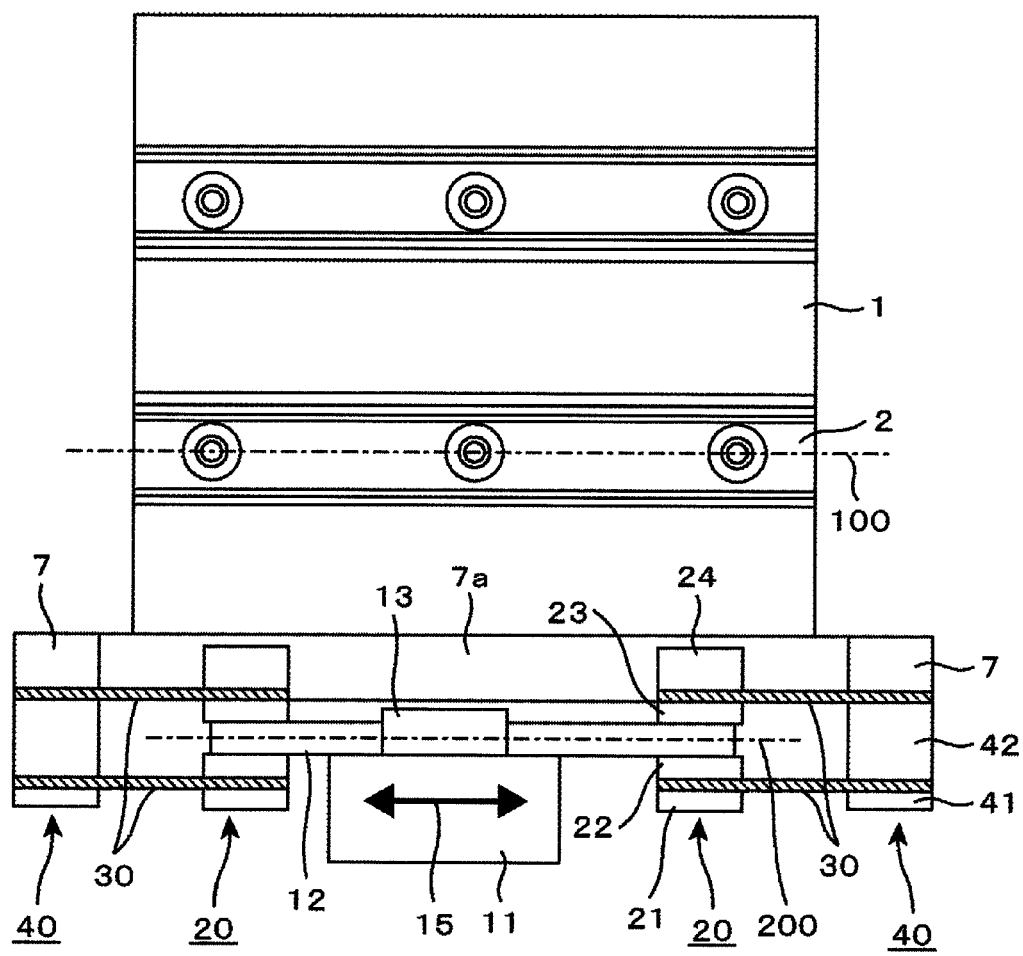
FIG. 3 is a top view illustrating the stage shown in FIG. 2.

FIG. 2 shows the structure in which the stage upper part 4, the attachment portion 5 and the actuator fixing member 6 are removed in order to facilitate the understanding thereof. FIG. 3 is a plan view which shows the structure shown in FIG. 2, observed from thereabove. With reference to both figures, it is understood that the driven bar 12 is gripped at its opposite ends by the parallel leaf springs 30 which are extended in parallel with the longitudinal direction of the driven bar 12. Further the guide rails 2 and the driven bar 12 are assembled so that their center lines 100, 200 are extended in parallel with each other.

As shown in FIG. 3, each of the co-fastening portions 20 includes two spacers (a spacer 22 and a spacer 23) which holds therebetween one end of the driven bar 12, and the spacers are in turn held at their outer surfaces between the parallel leaf springs 30 by means of a gripping portion 21 and a gripping portion 24 which are then secured by screws. It is noted here that the above-mentioned co-fastening portions 20 are held by the driven bar 12 and the parallel leaf springs 30 without making contact with an attachment lower part 7a. Further, the parallel leaf springs 30 are fixed to the attachment member 78 with screws by a gripping portion 40, a spacer 42 being interposed therebetween.

Since the attachment member 7 for the parallel leaf springs is integrally incorporated with the stage lower part 1, and is accordingly, not movable. Thus, the parallel leaf spring gripping portion 40 connected to the attachment member 7, the co-fastening portion 30 and the driven bar 12 are not displaced even though the actuator 10 is driven, and accordingly, the actuator body 11 alone is moved in the direction of the arrow 15 along the driven bar 12. Thus, the stage upper part 4 is driven (displaced) in the direction of the arrow 8 shown in FIG. 1.

Next, explanation will be hereinbelow made of the lowering of both positioning accuracy and reliability caused by manufacturing and assembling errors, and also of the technical effects exhibited by the driven bar 12 which is gripped by the spring mechanism, according to the present invention.

Figure 4:
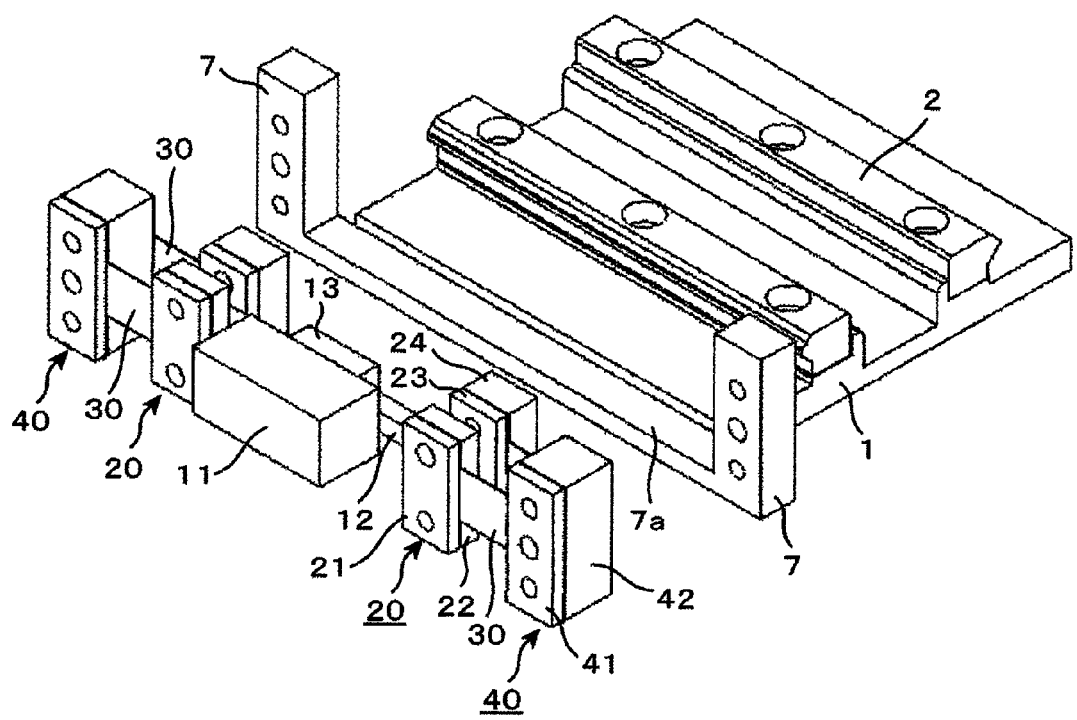
FIG. 4 is an assembling view of the first embodiment.

FIG. 4 shows the condition that the driven bar 12 of the actuator 10 is gripped at its opposite ends by the parallel leaf springs 30 before it is attached to the attachment portions 7. As stated above, the attachment portions 7 are integrally incorporated with the stage lower part (base part) 1, and the attachment lower parts 7 are provided between the attachment portions 7 on both sides so as to position lower than the stage lower part 1 without making contact with the lower surfaces of the co-fastening portions 20.

Figure 5A:
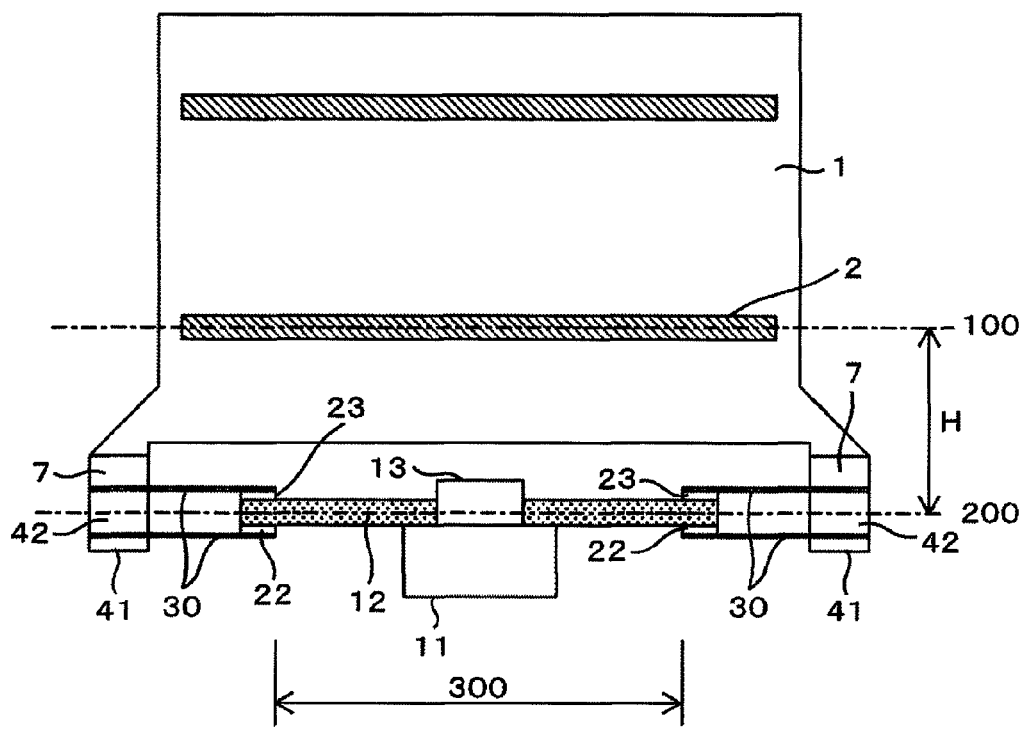
FIG. 5A is a view for explaining manufacturing errors and assembly errors in the first embodiment.
Figure 5B:
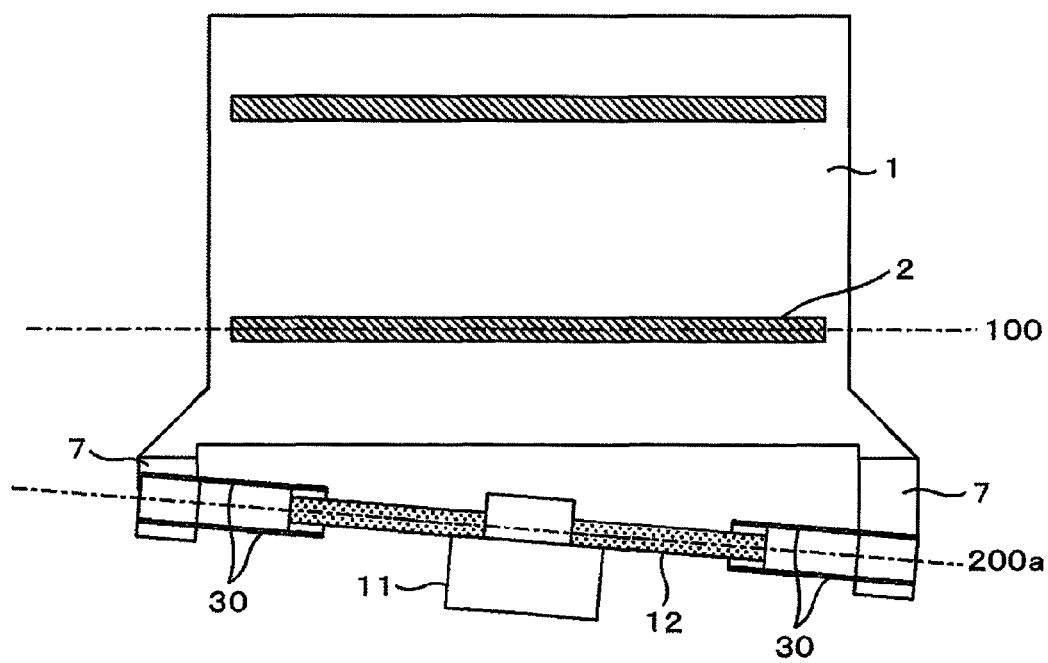
FIG. 5B is a view for explaining manufacturing errors and assembly errors in the first embodiment.

FIG. 5A conceptually shows main components in this embodiment, which have been ideally manufactured (inclusion of machining of component parts) and assembled, and FIG. 5B shows the case that thicknesses of the attachment portions 7 for the parallel leaf springs are uneven (different) due to the manufacturing tolerance (errors), as an example of manufacturing and assembling errors.

As shown in FIG. 5A, in the case that the components have been ideally manufactured and assembled, the center line 100 of each of the guide rails 2 and the center line 200 of the drive bar 12 are extended in parallel with each other, and accordingly, the body 11 of the actuator 10 can be moved between the opposite ends of the driven bar 12 (a movable range 300) while the distance H between the center line 100 of the each guide rail 2 and the center line 200 of the driven bar 12 is not changed. Thus, the distance between the stage upper part 4 which is guided by the guide rails 2, and the driven bar 12 is also not changed (that is, it is constant).

On the other hand, as shown in FIG. 5B, if the thicknesses of the attachment portions 7 are different from one another, the center line of the driven bar 12 is as indicated by 200a which is not in parallel with the center line 100 of the guide rail 2. Specifically, when the actuator body 11 is moved toward the right side as FIG. 5B is viewed face-to-face, the distance therebetween is increased, but when the actuator body 11 is moved toward the left side, the distance therebetween is decreased. Thus, the distance between the stage upper part 4 guided by the guide rails 2 and the driven bar 12 varies.

In the case of the ideal manufacturing and assembling, the condition shown in FIG. 5a can be expected. However, it is usual that the center line of the guide rail and the center line of the driven bar are not in parallel with each other due to the manufacturing and assembling tolerance of the component parts. In particular, in the actuator 10 which utilizes a piezoelectric element as a drive source, the driven bar 12 is usually made of ceramic materials in order to enhance the slide resistant function of the driven bar 12 with respect to the piezoelectric element. Since the ceramic materials are manufactured being sintered, the management for the manufacturing accuracy is difficult, and further, the management for setting the driven bar 12 so as to have predetermined dimensions with the use of an additional working steps for compensating the manufacturing errors, is also difficult. Thus, even though the metallic component parts such as the attachment portions 7, the parallel leaf spring gripping portions 40, the co-fastening portions 20 and the like are manufactured with a high degree of accuracy, since the manufacturing accuracy of the ceramic bar dominates the assembling accuracy of the positioning device, it is difficult to assemble these components so as to finally constitute the positioning device as shown in FIG. 5A in which the center line 100 of the guide rail is in parallel with the center line 200 of the driven bar. Thus, it may be considered that they are both not in parallel with each other with a high degree of possibility as shown in FIG. 5B.

Figure 6A:
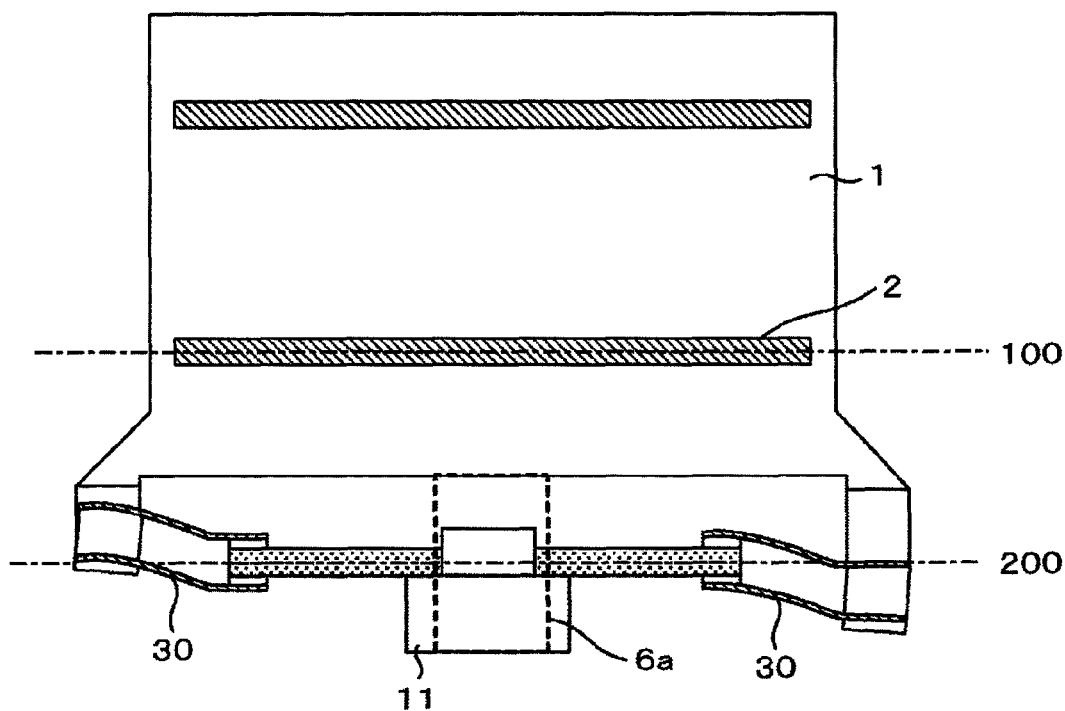
FIG. 6A is a view for explaining the technical effects and advantages which can be exhibited by the first embodiment.

In this embodiment, even though they are not in parallel with each other as shown in FIG. 5B, since the driven bar 12 is gripped by the parallel leaf springs 30, the parallel leaf springs 30 are deformed in a direction perpendicular to the travelling direction of the stage upper part (movable table), indicted by the arrow 8 (the travelling direction of the actuator body 11), as shown in FIG. 6A, thereby it is possible to prevent a deformation force from being exerted to (generated at) each of the opposite ends of the driven bar 12. It is noted that the broken line 6a indicates an outer edge of an attachment jig 6. Further, the parallel leaf springs 30 are formed of two thin sheets which are in parallel with the center line of the driven bar 12, and accordingly, their rigidity is high against a tension in the longitudinal direction of the driven bar 12. Thus, even though the parallel leaf springs 30 are pulled by the driven bar 12, the parallel leaf springs 30 can be prevented from being deformed in the longitudinal direction thereof so as to prevent the travelling of the actuator body 11 of the actuator 10 from being hindered.

Figure 6B:
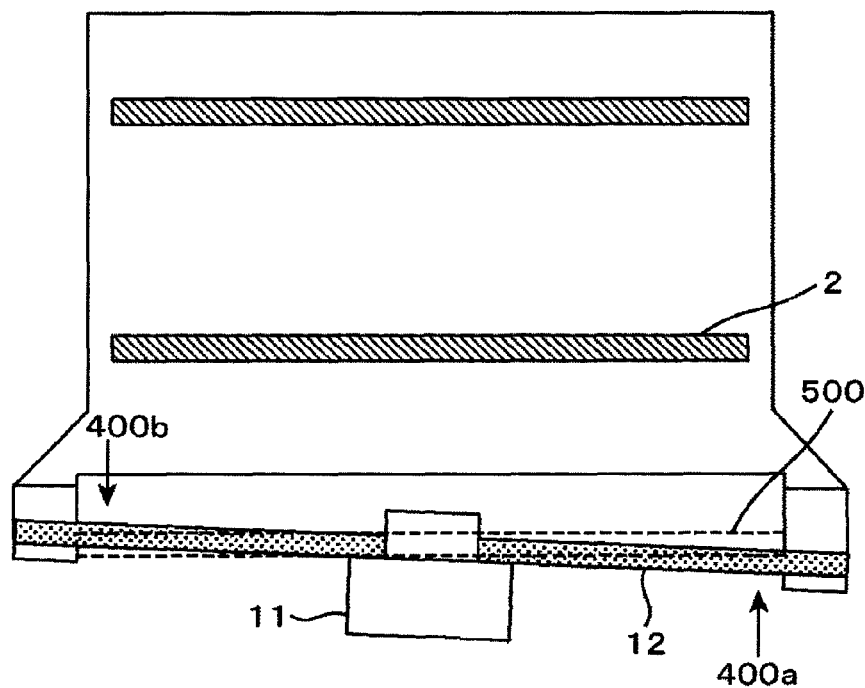
FIG. 6B is a view for explaining the technical effects and advantaged which can be exhibited by the first embodiment.

Meanwhile, FIG. 6B shows an example, that is, the configuration that there are no parallel leaf springs 30 as explained in this embodiment. As stated above, the actuator body 11 of the actuator 10 is mounted on the stage upper part 4 by means of the actuator fixing member 6 with a predetermined space therebetween. Thus, when the actuator body 11 is moved in the rightward direction as viewed in the figure, the space between the driven bar 12 and the center line 100 of the guide rail (the stage upper part 4) becomes wider and wider, and accordingly, the deformation force 400a that tends to decrease the space (to the distance given by the actuator fixing member 6) is exerted to the right end of the driven bar 12. It is noted that the broken line shown in FIG. 6B indicates the position of the driven bar 12 which is attached in parallel with the guide rails 2.

Meanwhile, when the actuator body 11 is moved in the leftward direction as viewed in FIG. 6B, the space between the driven bar 12 and the center line 100 of the guide rail (the stage upper part 4) becomes narrower and narrower, and accordingly, the deformation force 400b that tends to widen the space is exerted to the left end of the driven bar 2. The above-mentioned forces are active to the actuator 10 as an external force which reduces the thrust force for driving the stage upper part 4. Further, should the parallelism therebetween be remarkably inferior, both deformation forces (400a, 400b) would become larger, resulting in the possibility of occurrence of damage or breakage to the gripping portion 50 since the driven bar 12 is formed of a ceramic material which is not elastically deformed. The occurrence of the breakage causes the stage upper part 4 to fail in its drive, and accordingly, the stage loses its positioning function. Further, dust generated from a breakage position would possibly stain a monitor chamber in the electron microscope. In general, the monitor chamber in the electron microscope is presented under vacuum, the degree of vacuum in the monitor chamber is lowered by gas or the like generated from the broken-out section of the breakage part, and as a result, the observation would possibly be subjected to adverse affects. If the strength of the driven bar 12 is high, since the above-mentioned external force is transmitted to the guide rails 2 by way of the actuator body 11, the actuator fixing member 6, the stage upper part 4 and the guide 3, the external force would possibly deform or damage the guide rails 2, resulting in the possibility of lowering the positioning accuracy.

As stated above, by gripping the opposite ends of the driven bar 12 with the spring mechanisms as in this embodiment, even though the driven bar 12 and the guide rails are not laid in parallel with each other due to manufacturing and assembling errors, the parallel leaf sprigs can be deformed in order to maintain the distance therebetween constant, the assembling of the positioning device can be facilitated. Further, the driven bar 12 or the guide rails can be prevented from being damaged, and it is possible to position the stage upper part with a high degree of accuracy while a high degree of reliability is ensured.

Figure 8A:
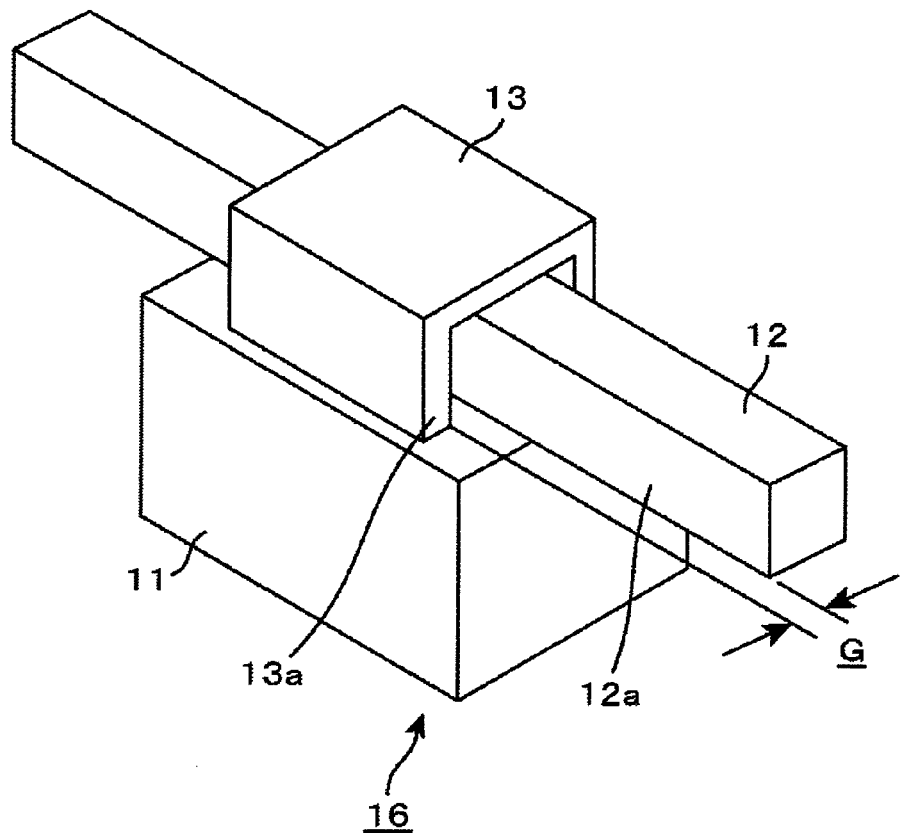
FIG. 8A is a view which shows the degree of freedom in a linear drive actuator having a large degree of freedom.
Figure 8B:
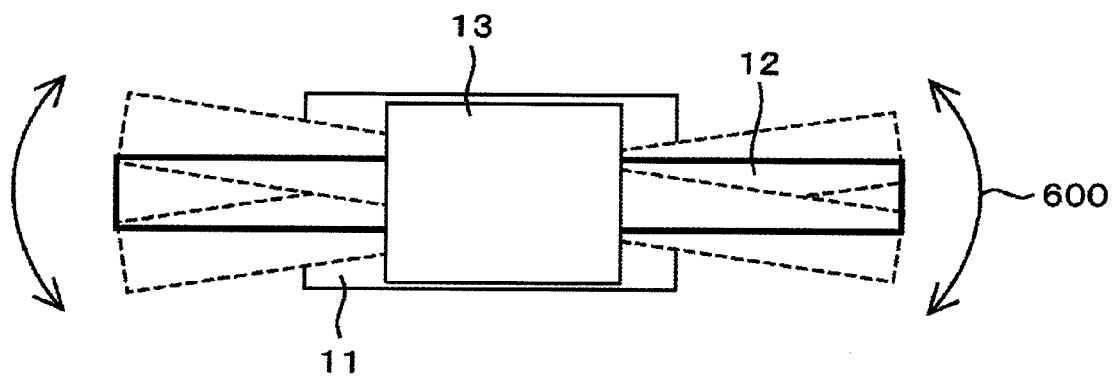
FIG. 8B is a view which shows the degree of freedom in the linear drive actuator having a large degree of freedom.

Next, explanation will be made of a second embodiment of the present invention with reference to FIGS. 8A to 10C. FIGS. 8A and 8B show a linear drive actuator which is similar to the linear actuator explained in the first embodiment, except that the degree of freedom as to the motion of the driven bar 12 is larger than that of the first embodiment by one. Specifically, as shown in FIG. 8A, a space G is defined between a side wall 13a of a cover 13 and a side wall 12a of the driven bar 12 (the part other than the surfaces where the driven bar 12 and the actuator are made into contact with each other), and accordingly, the linear drive actor can be moved within a plane in the direction of the arrow 600, as shown in FIG. 8B. With the use of the degree of freedom which is larger by one, an object of this embodiment is to provide a highly accurate and reliable positioning device which can absorb the manufacturing and assembling tolerances and which can be manufactured in a relatively simple manner. It is noted, in the second embodiment, that like reference numerals are used to denote like parts to those in the first embodiment.

Figure 9:
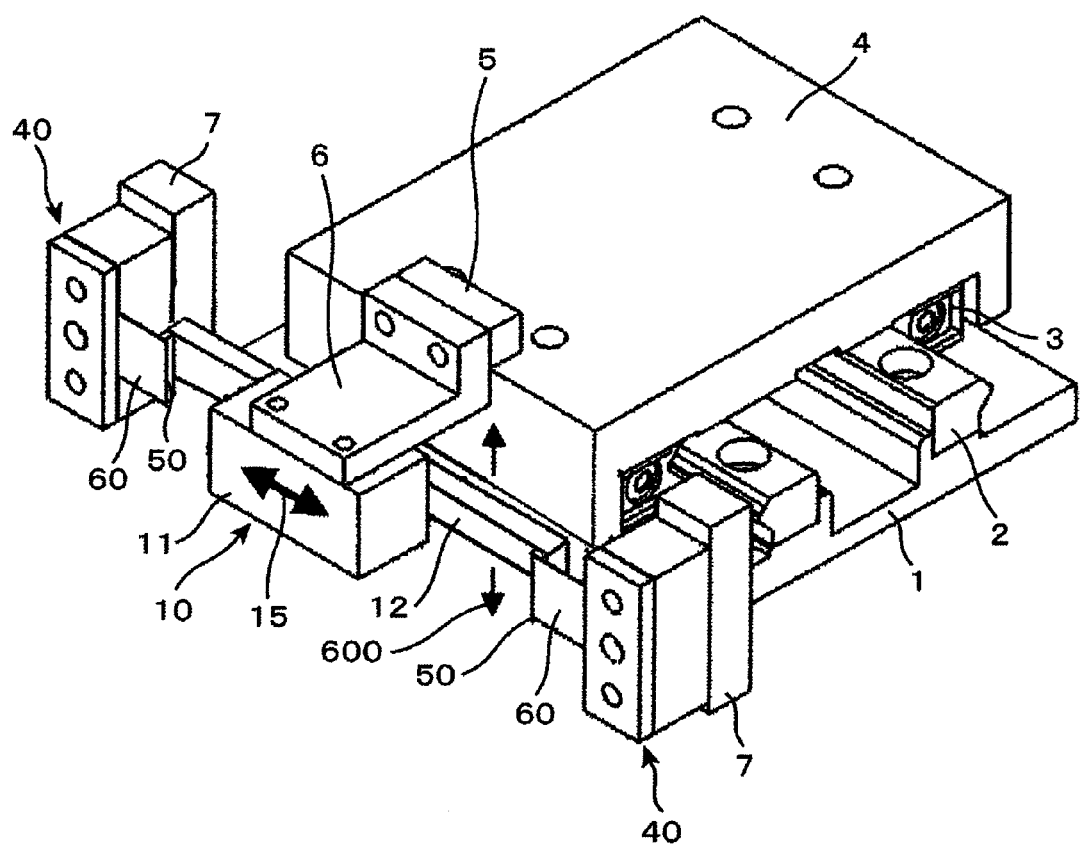
FIG. 9 is a perspective view illustrating a second embodiment.

FIG. 9 is a perspective view illustrating the second embodiment. In this embodiment, the linear drive actuator 16 shown in FIGS. 8A and 8B is attached so as to be movable in the plane of the driven bar 12 in the direction indicated by the arrow 600, that is, in the direction perpendicular to the horizontal surface of the guide rails 2 laid on the stage lower part 1 (that is, it is movable in a direction perpendicular to the horizontal surface of the stage upper part 4).

In the second embodiment, similar to the case shown in FIG. 6B with which the technical effects exhibited by the first embodiment is explained, even in the case that the driven bar 12 and the guide rails are assembled not in parallel with each other due to the manufacturing and assembling tolerances, a deviation (error) from the parallelism therebetween can be absorbed by the spring mechanisms (leaf springs 60) for supporting the driven bar 12. With this arrangement, the force which is exerted to the guide rails and the driven bar 12 can be reduced.

Figure 10A:
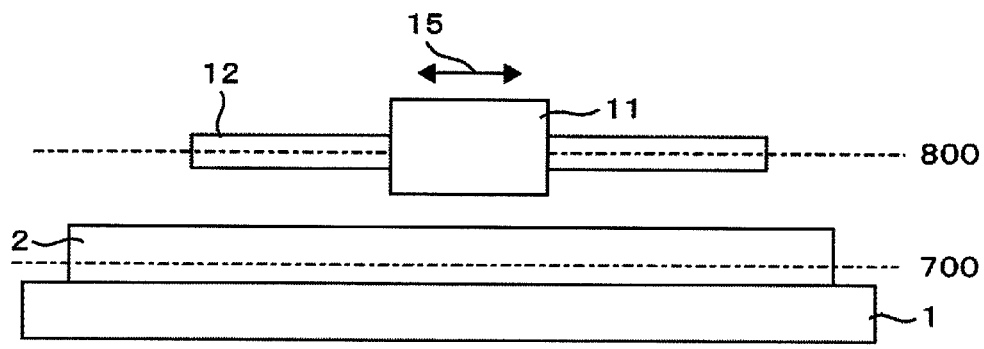
FIG. 10A is a view for explaining the technical effects and advantages which can be exhibited by the second embodiment.
Figure 10B:
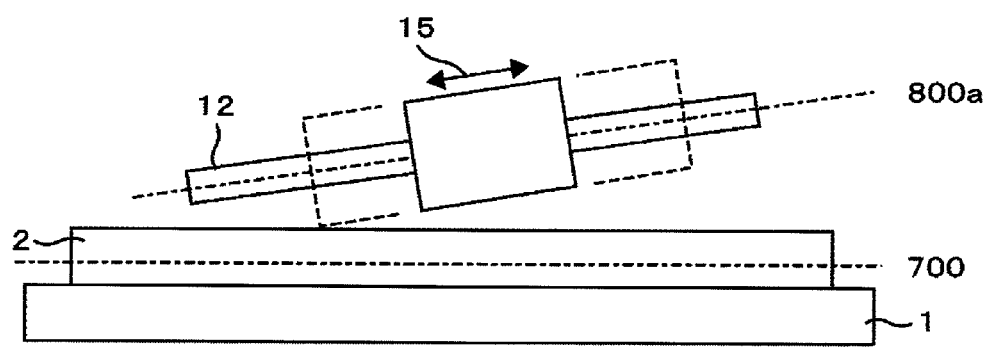
FIG. 10B is a view for explaining the technical effects and advantaged which can be exhibited by the second embodiment.
Figure 10C:
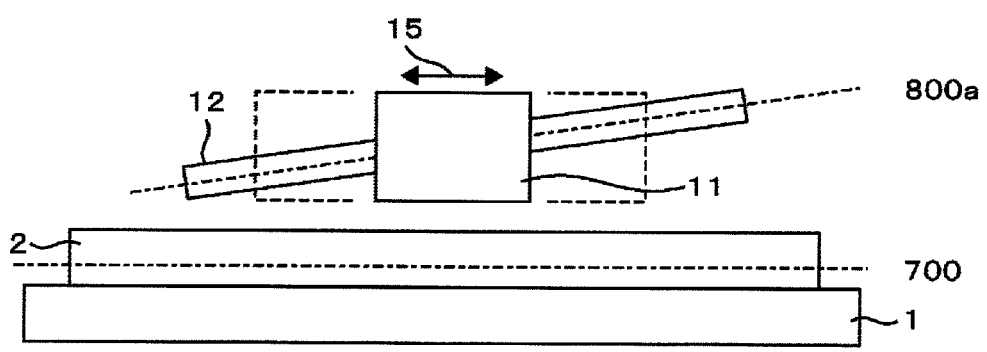
FIG. 10C is a view for explaining the technical effects and advantages which can be exhibited by the second embodiment.

Next, explanation will be hereinbelow made of the technical effects and advantages peculiar to the second embodiment with reference to FIGS. 10A to 10C. FIG. 10A shows an image of the positional relationship between the guide rails 2 laid on the stage lower part 1, and the driven bar 12, as viewed sidewise of the stage, that is, FIG. 10A shows the positional relationship between the guide rails 2 and the driven bar 12, outward in the plane of the stage lower part 1. As shown in FIG. 10A, in the case of no manufacturing and assembling tolerances, the center line 700 of the guide rails 2 and the center line 800 of the driven bar 12 are laid in parallel with each other in the heightwise direction. However, as shown in FIG. 10B, the center line 700 of the guide rail 2 and the center line 800 of the driven bar 12 are usually deviated from each other in the heightwise direction due to the manufacturing and assembling tolerances. Further, the stage upper part (which is not shown) is connected to the actuator body 11 which is moved along the driven bar 12. Meanwhile, the stage upper part is moved being guided by the guide rails 2. Thus, if both center lines are not in parallel with each other in the heightwise direction as shown in FIG. 10B, when the stage upper part is moved in the rightward direction as viewed in the figure, since the driven bar 12 cannot be moved in any direction other than the rectilinearly advancing direction (since it has not the degree of freedom in the direction indicated by the arrow 600 as shown in FIGS. 8A and 8B) is not present), the actuator 10 (as sown in FIGS. 7A to 7d) with a lower degree of freedom is moved along the driven bar 12 (as indicated by the dotted line). As a result, the stage upper part which is connected to the actuator body 11 would be lifted up from the stage lower part (guide rails 2). Should the stage upper part be lifted up, the height of a sample carried on the stage upper part would be changed, resulting in the requirement for refocusing the electron microscope and so forth. Further, since the stage upper part would be floated up from the guide rails 2, the stage upper part cannot be guided properly, and as a result, there would be possibly caused the risk that the degree of positioning accuracy is lowered.

However, as explained in the second embodiment, with the configuration that the linear drive actuator 16 shown in FIGS. 8A and 8B, is attached as shown in FIG. 9, the driven bar 12 can be moved freely in the direction indicated by the arrow 600 in FIG. 8B even though the guide rails 2 and the driven bar 12, which are shown in FIG. 10B, are not laid in parallel with each other, and accordingly, the heightwise errors between both center lines shown in 10B can be absorbed. Specifically, as shown in FIG. 10C, even though the actuator body 11 is moved along the driven bar 12 which is not in parallel with the guide rails 2, the actuator body 11 does not change its height (the distance from the guide rails) or its posture (as indicated by the dotted line). Thus, it is possible to exhibit the technical effects and advantages which are substantially the same as that exhibited by the configuration that they are laid in parallel with each other, as shown in FIG. 10A. Thus, as stated above, it is possible to prevent the lifting-up of the stage upper part and as well to prevent the degree of positioning accuracy from being lowered. Thus, also in this embodiment, similar to the first embodiment, it is possible to provide a stage positioning device with a high degree of accuracy, which can be easily assembled.

It is noted in the second embodiment that the driven bar 12 is attached at its opposite end to the leaf springs 60 by means of an adhesive. Further, each spring mechanism includes a singles leaf spring, instead of the two parallel leaf springs.

In the first embodiment in which the driven bar12 is joined at its opposite ends to the parallel leaf springs by means of screws, the weight of the stage positioning device becomes heavier by the weights of the screws. Further, since the driven bar 12 made of a ceramic material cannot be formed therein with threaded holes, the sandwich structure therefor is indispensable (refer to FIG. 3), the co-fastening portions 20 through which the screws are attached becomes larger. However, with the use of the adhesive, instead of the screws, it is possible to eliminate the necessity of screws, and as well to eliminate the necessity of the co-fastening potions. As result, the stage positioning device can be small-sized and lightweight, and accordingly, the driven bar 12 can be driven at a higher speed with a higher degree of accuracy. Further, the required number of component parts can be decreased, and accordingly, it is possible to enhance the productivity thereof. Further, using the single leaf spring, instead of the two parallel leaf springs, the required number of component parts can be also decreased, thereby it is possible to enhance the productivity thereof, and as well, reduce the costs thereof. Further, by changing the size and the thickness of the leaf spring, the technical effects and advantages equivalent to that obtained by the parallel leaf springs 30 can be exhibited, and accordingly, the second embodiment can exhibit the technical effects and advantages the same as that exhibited by the first embodiment.

Figure 11:
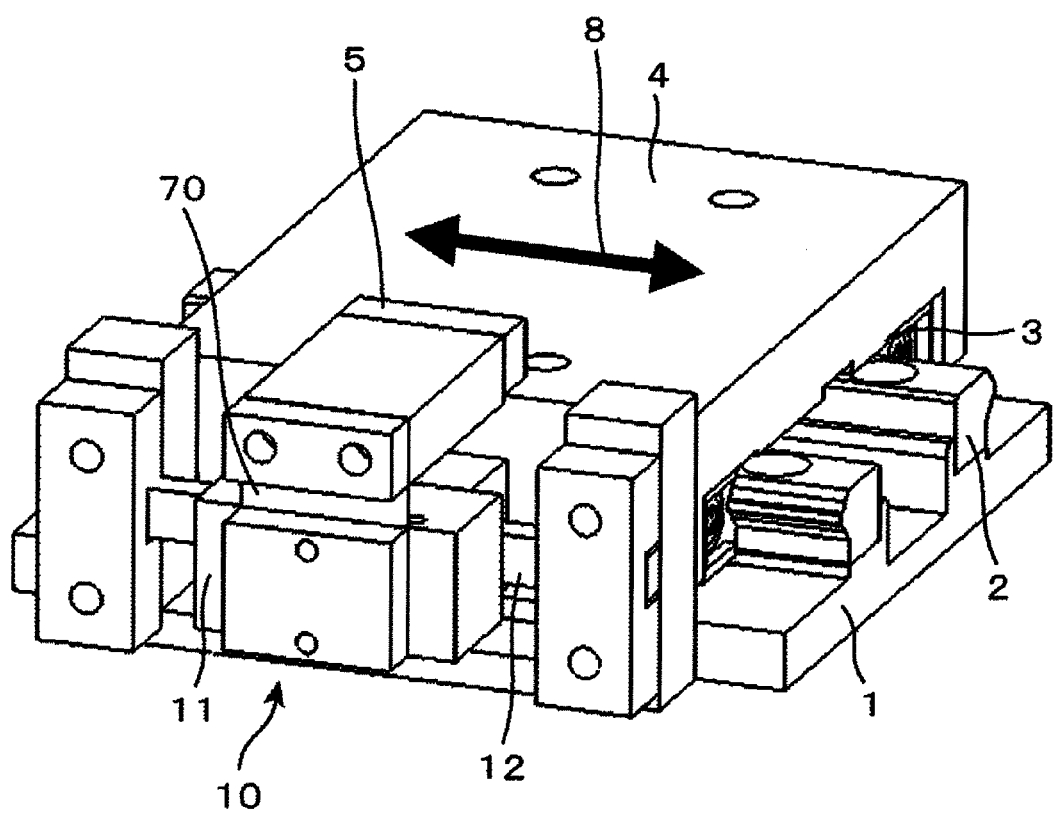
FIG. 11 is a perspective view illustrating a third embodiment.

A third embodiment of the present invention is illustrated in a perspective view as in FIG. 11.

This embodiment is similar to the first embodiment except that there is used a spring mechanism which can prevent the driven characteristics of a motor from being hindered, between the driven bar 12 and the actuator body 11. Specifically, as shown in FIG. 11, the actuator body 11 is held on the stage upper part 4 by using a leaf spring 70 while the driven bar 12 is rigidly coupled to the stage lower part 1. By changing the section which carries the spring mechanism from the driven bar 12 into the actuator body 11, the purpose of this embodiment is to provide a highly reliable stage positioning device with a high degree of positioning accuracy, which can prevent the drive characteristics from being hindered, which can absorb the manufacturing and assembling errors, and which can be manufactured in a more simpler manner. It is noted also in this embodiment that like reference numerals are used to denote like parts to those explained in the first embodiment.

In this embodiment, the actuator 10 shown in FIG. 7A to 7D is mounted in such a manner that the driven bar 12 is rigidly fixed to the stage lower part 1, and accordingly, the actuator body 11 is moved by the spring mechanism in a direction perpendicular to the direction indicated by the arrow 8.

Different from the first embodiment, the driven bar 12 is rigidly coupled at its opposite ends to the stage lower part 1, and further, an actuator fixing member using a signal leaf spring is used to attach the actuator body 11 onto the stage upper part 4 by means of the spring mechanism.

The driven bar 12 are joined at its opposite ends with the use of the four parallel leaf springs in the first embodiment. However, in the first embodiment, the required number of component parts is larger, and further, the parallel leaf springs are extended in the longitudinal direction of the driven bar 12, and accordingly, it is required to set the length of the stage lower part 1 to a value which is longer than that of the driven bar 12, However, with the use of the spring mechanism for the actuator body 11, instead of the four parallel leaf springs for joining the opposite ends of the driven bar 12, the required number of component parts can be decreased. Further, the distances of the attachment positions which are overhanging in the longitudinal direction of the driven bar 12 can be decreased. As a result, the stage positioning device can be small-sized and light weight. With the use of the single leaf spring 70, instead of the four parallel leaf springs, the required number of component parts can be reduced, thereby it is possible to reduce the costs and the manhours for manufacturing and assembling the stage positioning device. Further, by changing the size and the thickness of the leaf spring 60, there can be exhibited technical effects and advantages equivalent to those exhibited by the parallel leaf springs 30, thereby it is possible to obtain technical effects and advantages which are the same as those exhibited by the first embodiment.

Specifically, in addition to the technical effects and advantages that the drive characteristics of the linear drive actuator are not hindered as explained in the first embodiment, even in the case that the driven bar 12 and the guide rails 2 are not assembled in parallel with each other due to the manufacturing and assembling tolerances, a deviation from the parallelism therebetween can be absorbed while vibrations which are effected in a direction perpendicular to the driving direction of the linear drive actuator can be absorbed by the spring mechanism (leaf spring 60) which carries the actuator body 11, and as well, the forces exerted to the guide rails and the driven bar 12 can be reduced. Thus, similar to the first embodiment, even in the third embodiment, it is possible to prevent the drive characteristics from being hindered, and accordingly, a highly reliable stage positioning device with a high degree of accuracy can be provided even thought the driven bars and the guide rails cannot be laid in parallel with each other.

In a method of installing the stage positioning device according to the present invention, the drive characteristics of the linear drive actuator can be prevented from being hindered, and the guide rails and the driven bar in the linear drive actuator can be laid substantially in parallel with each other by means of the spring mechanism even though the parallelism therebetween is deviated, thereby it is possible to position the stage with a high degree of accuracy.

In more detail, in the case that the stage upper part and the actuator body are rigidly connected to each other, since the opposite ends of the driven bar are connected to the stage lower part (stationary group, the guide rail attachment portions) by means of the parallel leaf springs, the actuator body is moved along the driven bar while the driven bar is moved in a direction perpendicular to the travelling direction, and as a result, it is possible to displace the stage upper part (movable table) which is connected to the actuator body while the drive characteristics of the actuator can be prevented from being hindered.

Meanwhile, the stage upper part is guided by the guide rails to be displaced. Accordingly, even though the driven bar and the guide rails are not laid in parallel with each other, since the stage upper part and the actuator body are rigidly coupled to each other while the distance between the driven bar and the guide rails varies, depending upon the position of the stage upper part (movable table), forces (deformation forces) would be exerted to the driven bar and the guide rails in order to maintain the distance between the stage upper part and the actuator body to be constant when the stage upper part is displaced. At this time, according to the present invention, the driven bar is gripped at its opposite ends by the spring mechanisms, the leaf springs are deformed by the above-mentioned forces so as to maintain the distance therebetween to be constant, thereby it is possible to prevent generation of a force.

Further, in the case that the driven bar is rigidly connected to the stage lower part (stationary group and the guide rail attachment portions), since the opposite ends of the driven bar are connected to the stage lower part (stationary group and the guide rail attachment portions), and since the actuator body is carried by the leaf springs, the actuator body is moved along the driven bar while it is moved in a direction perpendicular to the travelling direction. As a result, it is possible to displace the stage upper part (movable table) connected to the actuator body without hindering the drive characteristics of the actuator.

Further, in the case that the driven bar and the guide rails are not laid in parallel with each other, even though the distance between the driven bar and the guide rails varies depending upon the position of the stage upper part (movable table), since the actuator body 11 is gripped by the spring mechanisms, according to the present invention, the actuator body 11 can be moved in response to a variation in the distance therebetween.

Next, explanation will be made of fourth to sixth embodiments of the present inventions.

Figure 12:
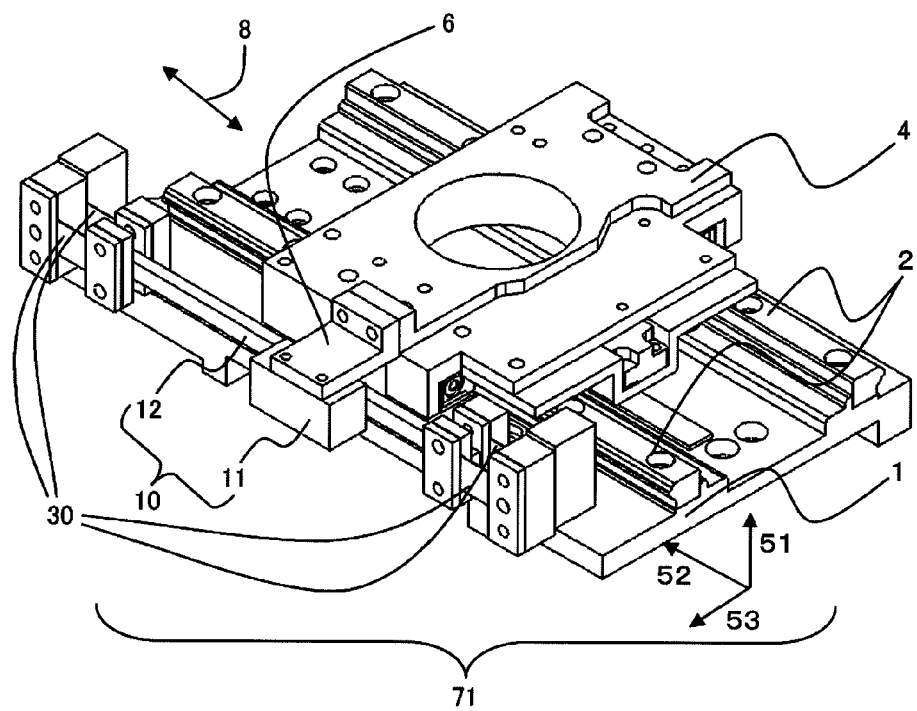
FIG. 12 is a perspective view illustrating the stage in the first embodiment.

With the fixing configuration of the actuator body shown in FIG. 12 in the embodiment which have been explained hereinbefore, since the heightwise position of the stage is determined equivocally by the actuator fixing member with which the actuator is connected to the movable table in the assembly, the assembling errors can hardly be caused in the heightwise direction of the stage. It is intended in the configurations stated in the fourth to sixth embodiments that the assembly errors can hardly be caused even in the directions other than the heightwise direction of the stage.

Further, even in the embodiment shown in FIG. 12, there is shown the configuration in which a drive shaft is provided at its opposite ends with leaf springs in order to absorb the assembling errors in the horizontal direction of the stage and as well to prevent the actuator from generating a stress. Accordingly, it is intended in the configurations stated in the fourth to sixth embodiments to restrain the assembling errors so as to prevent the assembly errors from exceeding the capacity of the leaf springs which can absorb the assembling errors.

Thus, in the fourth embodiment, the actuator fixing member which couples the actuator body with the movable table has the configuration that the actuator fixing member is made into contact with the actuator body at its two surfaces in both horizontal and heightwise direction of the stage. Further, in the fifth embodiment, the configuration of coupling members with which the drive shaft is coupled with the leaf springs and the configuration of base coupling members with which the leaf springs are coupled with the base, are arranged so as to be capable of positioning the drive shaft in the heightwise direction of the stage. Further, in the sixth embodiment, there are provided assembling steps such that the drive shaft are fixed at its opposite ends thereto with coupling members after the actuator body is fixed to the actuator fixing member, and the base coupling members are finally fixed.

Explanation will be hereinbelow made of the configuration of the fourth embodiment with reference to the accompanying drawings.

Figure 13:
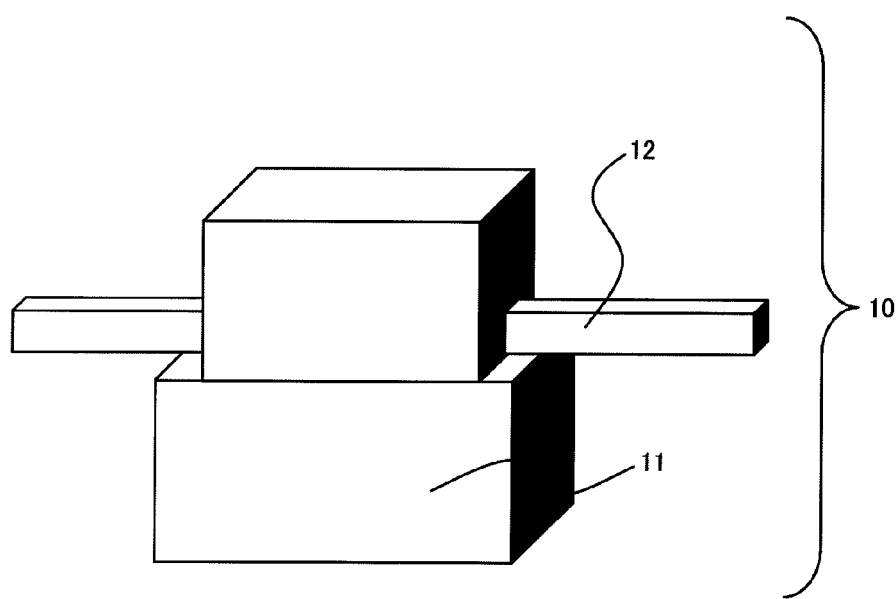
FIG. 13 is a view which shows the structure of the actuator.

FIG. 13 shows the configuration of the actuator. The actuator 10 incorporates a plurality of oscillation type piezoelectric elements (which are not shown) which are embraced in the actuator body 11, and the piezoelectric elements are arranged so that their front end parts are made into contact with the drive shaft 12. It is required that the actuator body 11 and the drive shaft 12 are fixed, independent from each other.

The drive shaft 12 are supported at its opposite ends by leaf springs (parallel leaf springs) 30 because of the following reasons which will be again explained with reference to FIGS. 14A to 14C which are partly sectioned schematic views:

The actuator body 11 utilizing the piezoelectric elements is exerted thereto with a drive force in a horizontal direction A (the longitudinal direction of the guide rail 2) 52 (the same direction as the travelling direction of the movable table indicated by the arrow 8) of the stage as a reaction force of the force which is exerted to the drive shaft 12 through the expansion and contraction and as well the flexion of the piezoelectric elements, but the actuator body is also shifted at the same time in a horizontal direction B (a direction perpendicular to the longitudinal direction of the guide rail 2) 53 of the stage. It is not preferable to impede the displacement in the horizontal direction B53 of the stage in view of the generation of the drive force. Thus, the drive shaft 5 should have the configuration that it can be deformed freely more or less in the horizontal direction B53 of the stage (first reason). It is noted that the direction in which the displacement occurs depends upon the direction in which the actuator 4 is arranged.

Since the actuator fixing member 6 which couples the actuator body 11 with the movable table 4 is not readily deformed so that the distance between the actuator body 11 and the movable table 4, is not changed, in the case that the longitudinal direction of the drive shaft 5 is not in parallel with the guide rails 2, it is required to restrain the force which is generated from the piezoelectric element during driving of the movable table 3 (second reason). Thus, there is required such a configuration that the drive shaft 5 can be deformed freely more or less in the horizontal direction B 53 of the stage.

In view of the reasons as stated above, the drive shaft 12 is supported at its opposite ends by the leaf springs (parallel leaf springs) 30.

Figure 14A:
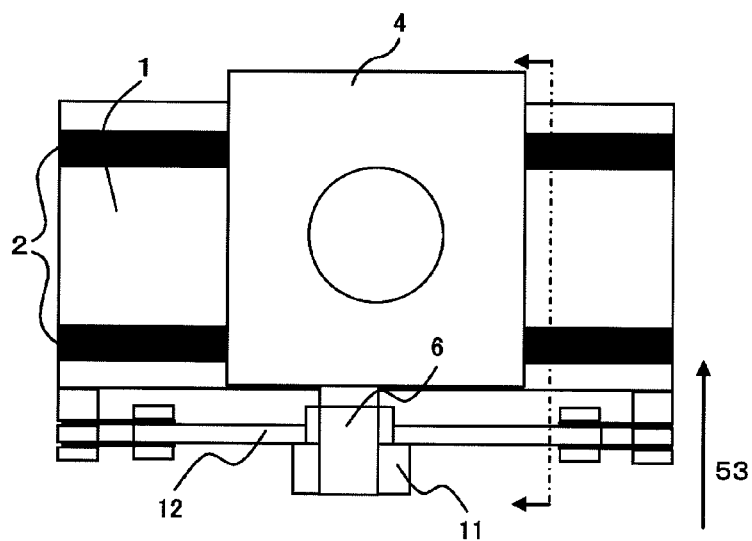
FIG. 14A is a sectional schematic view illustrating the stage shown in FIG. 12.
Figure 14B:
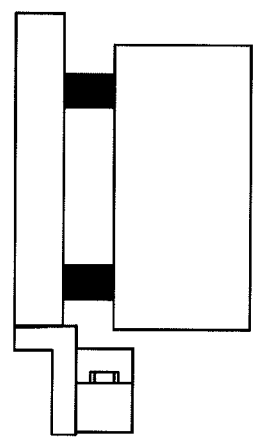
FIG. 14B is a sectional schematic view illustrating the stage shown in FIG. 12.
Figure 14C:
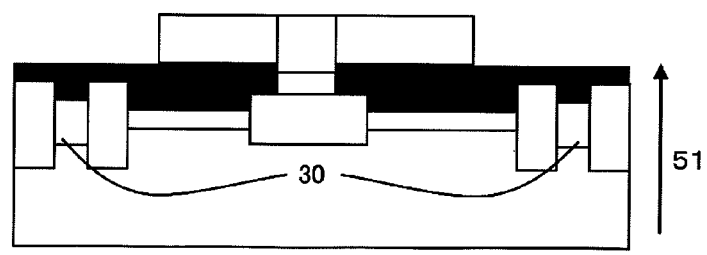
FIG. 14C is a sectional schematic view illustrating the stage shown in FIG. 12.

By the way, the actuator fixing member 6 shown in FIGS. 14A to 14C is arranged in such a configuration that it is positioned above the actuator 10 and is made into contact with the stage upper side surface of the actuator body 10, and accordingly, it is unlikely to cause assembling errors in the stage heightwise direction 51. Meanwhile, the actuator fixing member does not have the configuration that can restrain assembling errors in the stage horizontal direction B 53, and accordingly, it is likely to cause large manufacturing errors in the stage horizontal direction B 53.

In view of the reason 2, there is provided such a configuration that the assembling errors are absorbed through the deformation of the leaf springs with which the drive shaft is supported at its opposite ends. However, there is a limitation as to the absorption capacity of the leaf spring, and accordingly, it is required to prevent the assembling errors caused by the actuator fixing member 6, from exceeding the capacity of the leaf spring for absorbing the assembling errors.

Thus, in the fourth embodiment, the actuator fixing member which couples the actuator body 11 with the movable table is configured so as to be made into contact with two surfaces in the respective stage horizontal and heightwise directions.

Figure 15:
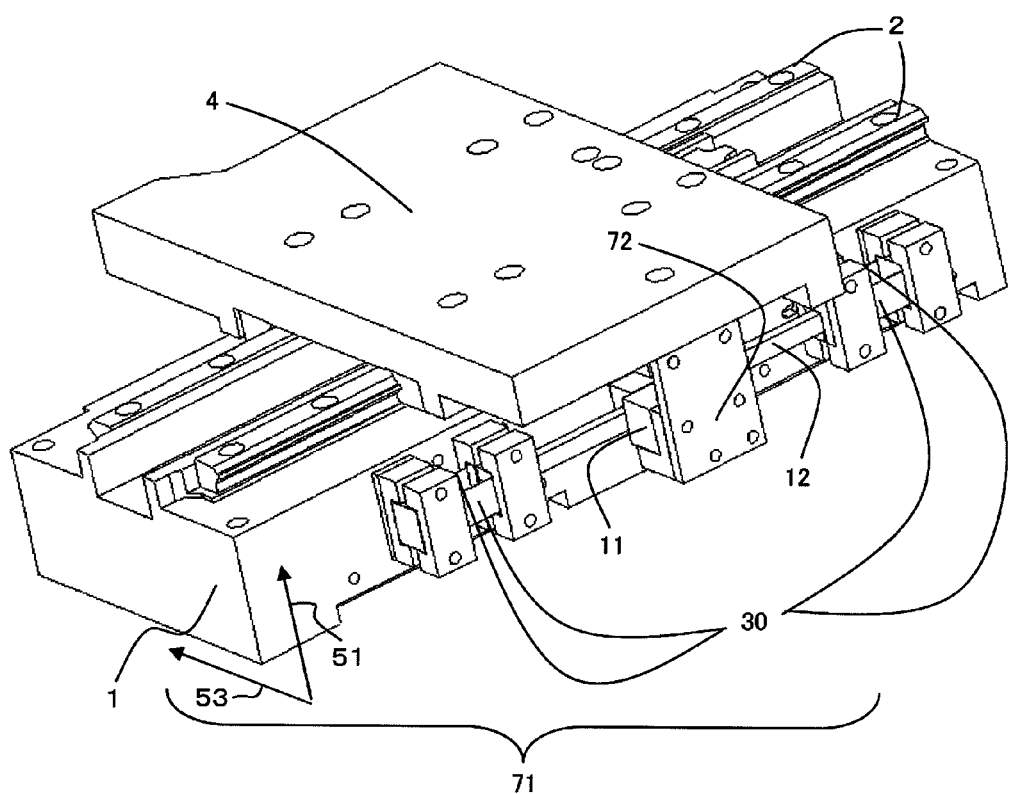
FIG. 15 is a perspective view illustrating a fourth embodiment.

FIG. 15 is a perspective view which shows the fourth embodiment. In this embodiment, an actuator fixing member 72 which fixes the actuator body 11, is configured so as to be made into contact with two surfaces in the respective stage horizontal and heightwise directions, and accordingly, it is possible to restrain the assembling errors in the stage horizontal direction B53 and the stage heightwise direction 51, and the assembling of the actuator body 11 onto the stage can be carried out with a high degree of accuracy.

With the stage shown in FIG. 12, in order to attach the actuator with a high degree of accuracy, it is required to loosen and fasten the actuator body 11 while the three-dimensional measurements are repeated so as to correct the assembling errors with the use of, for example, a highly accurate three-dimensional measuring unit. In the fourth embodiment, the assembling can be made with a high degree of accuracy even without having the highly accurate three-dimensional unit during the attachment of the actuator, thereby it is possible to greatly reduce the manufacturing costs thereof.

Figure 16A:
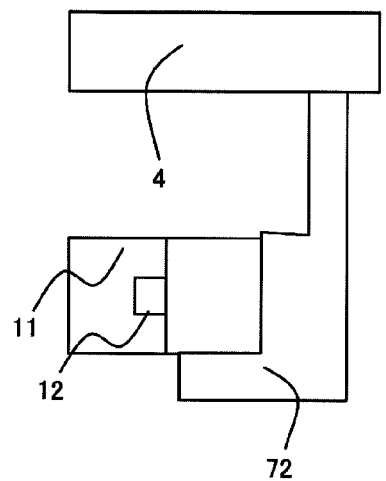
FIG. 16A is a view illustrating a variant form of an actuator fixing member.
Figure 16B:
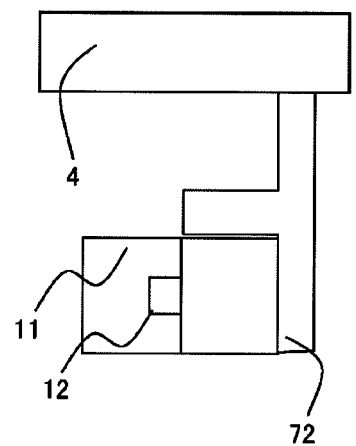
FIG. 16B is a view illustrating a variant form of an actuator fixing member.
Figure 16C:
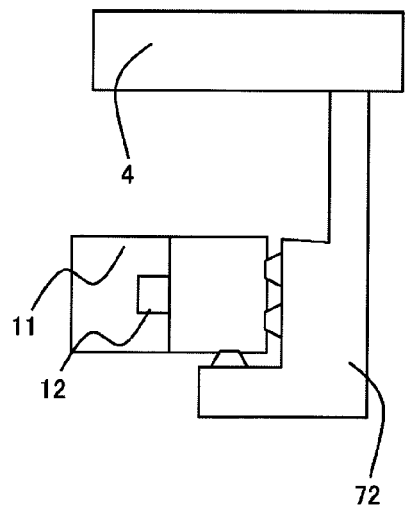
FIG. 16C is a view illustrating a variant form of an actuator fixing member.

FIGS. 16A to 16C show variations of the actuator fixing member 72, which can be considered to be used. Since the actuator body 11 shown in FIG. 15 has a substantially rectangular parallelepiped shape, the actuator fixing member 72 is made into surface-contact with the actuator body 11 as shown in FIG. 16A in order to restrain the assembling errors in the stage heightwise direction 51 and the stage horizontal direction B 53. Meanwhile, the actuator fixing member 72 may be made into contact with the actuator body 11 at different surfaces thereof, as shown in FIG. 16B. Further, the actuator fixing member may be made into point- or line-contact with the actuator body 11 as shown in FIG. 16C in order to appropriately locate the latter. Thus, even though the actuator body 11 has a complicated shape (other than the substantially rectangular parallelepiped body), the assembling thereof can be made with a high degree of accuracy.

Next, explanation will be made of a fifth embodiment.

In the actuator 10, the drive shaft 12 and the actuator body 11 define therebetween a clearance in order to prevent the output power of the actuator 10 from being hampered, except between the surfaces of the drive shaft 12 and the piezoelectric element which are made into contact with each other. Referring to FIG. 14, although the leaf springs 30 can be hardly deformed in the stage heightwise direction 51 due to its arrangement configuration, by setting the clearance so as to extend in the actuator in the stage heightwise direction 51, the clearance in the actuator can absorbs the assembling errors. Namely, the clearance in the actuator may have two purposes, that is, the function capable of preventing the output power from being hampered and the function capable of absorbing the assembling errors.

However, the embodiment shown in FIG. 12, the coupling method between the drive shaft 12 and the leaf springs 30 is such that the drive shaft 12 and the leaf springs 30 are fixed between a plurality of substantially sheet-like members which are arranged in parallel with one another in the stage heightwise direction 51, and accordingly, this configuration cannot make the positioning of the drive shaft 12 in the stage heightwise direction 51.

Thus, explanation will be made of the fifth embodiment which is capable of making the positioning of the drive shaft in the stage heightwise direction 51, with reference to FIG. 17.

Although the coupling members 101 between the drive shaft 12 and the leaf spring 30 are composed of a plurality of component parts, and are located symmetrically at opposite ends of the drive shaft 5, FIGS. 6A and 6B show the coupling member 101 which is exploded at only one end thereof, for the sake of brevity. The coupling member 101 is composed of two drive shaft attachments 103 which make contact with the drive shaft 12 at two surfaces on the stage lower surface side surface in the stage heightwise direction 51 and the stage horizontal direction, and which are opposed to each other interposing therebetween the drive shaft 12, and two U-like members 104 which are arranged to embrace the drive shaft attachments 103, respectively. The leaf springs 30 are arranged being held between drive shaft attachments 103 and the recesses formed in the U-like members 104, and are fixed by fastening the U-like members 104 located at the outermost side position with the use of coupling members with screws (the number of the component parts as shown is for one side of the stage, but the number twice this number is required for the opposite sides of the stage).

Further, the leaf springs and the base are fixed to each other with the use of base coupling members 102 each composed of several component parts, that is, two U-like members 104, a single space A105, and a single U-like base attachment 107 (The number of the component parts as shown is for one side of the stage, but the number twice this number is required for the opposite sides of the stage).

The fastening of the coupling members 101 and the base coupling members 102 with the use of screws is carried out in such a way that an attachment jig 108 is fastened to the base 1, and the coupling member 101 composed of the U-like member 104 and the like is set in the recesses of the attachment jig 103 in the direction in the mounting direction 109, a spacer B105 being held between the U-like members 104 and the base 1. With this way, the U-like member 104 and the drive shaft attachments 103 embraced in the U-like members 104 are precisely positioned both in the stage heightwise direction 51 and the stage horizontal direction B 53, and as a result, the drive shaft 5 can be readily assembled with a high degree of parallelism with respect to the guide rails 2. It is noted that the attachment jig 108 and the spacer B106 are withdrawn after the assembling is completed.

The contact of the drive shaft attachments 103 with the drive shaft 5 is selective freely, that is, either line-contact or point contact may be used similar to the fourth embodiment shown in FIG. 16. The optimum contact may be selected in view of the stage requirement specification.

Next, explanation will be made of the assembling steps of the stages, in order, in the sixth embodiment of the present invention.

At first, explanation will be made of the difference between the assembling stresses which are exerted to the actuator 10 that has been assembled in two different assembling ways in the case that the positions of the leaf springs 30 located at opposite ends of the drive shaft 12 and attached to the base 1, are off from the designed positions thereof toward the base 1, due to the machining errors or the like, with reference to FIGS. 18.

Figure 18A:
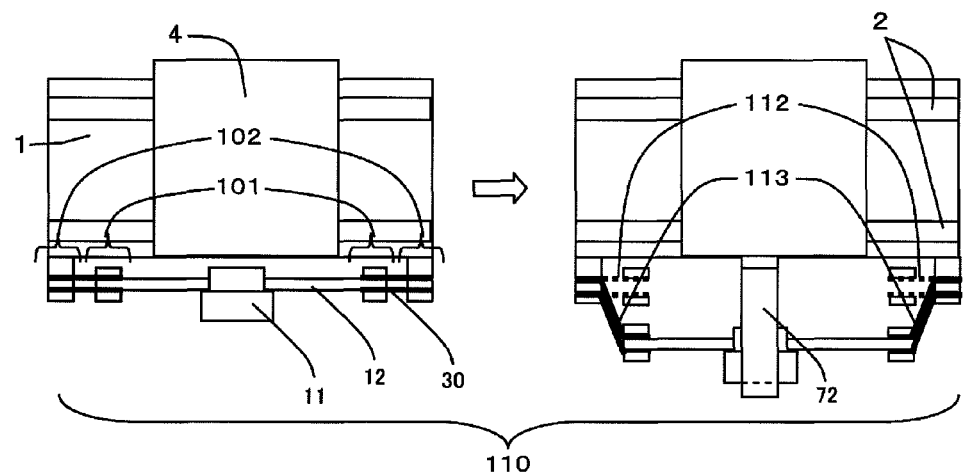
FIG. 18A is a schematic view of a stress producing mechanism during assembly of leaf springs.

The assembling way A shown in FIG. 18A is such that the actuator body 11 is fixed to the actuator fixing member 72 after the coupling members 101 and the base coupling members 102 are fixed respective to the opposite ends of the drive shaft 12. In this case, in order to fix the actuator fixing member, the leaf springs 30 are shifted from the leaf spring condition A 112 into the leaf spring condition B 113, the tensile force and the bending force are mainly generated.

Figure 17:
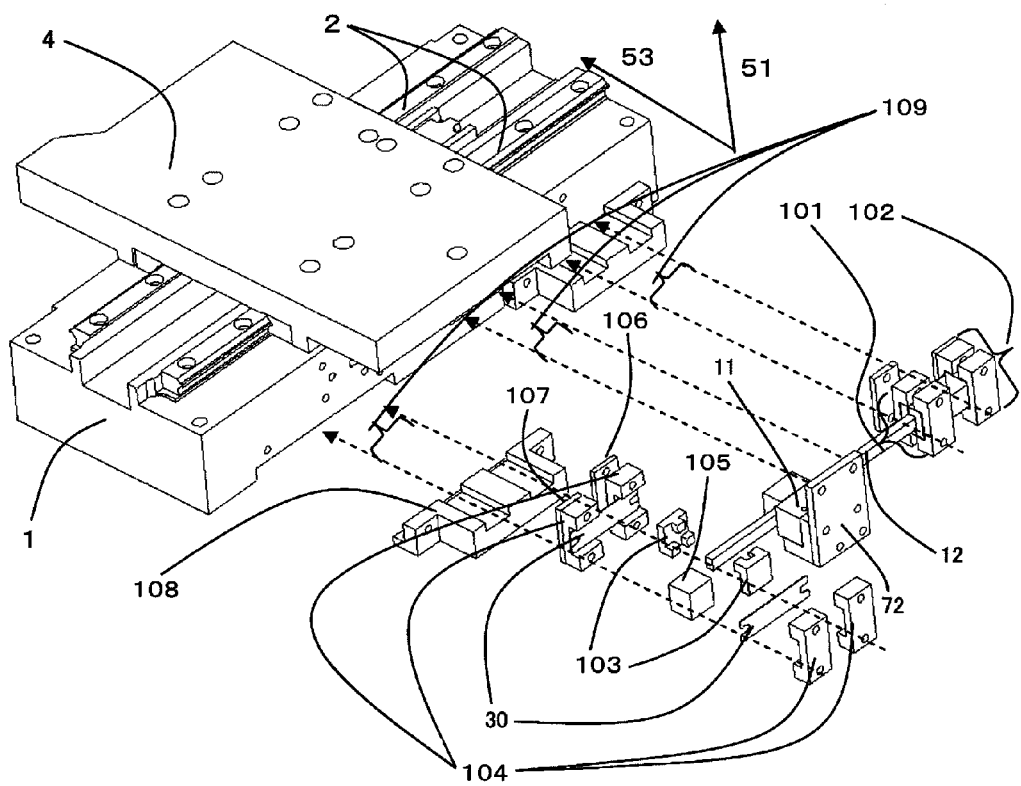
FIG. 17 is an exploded view illustrating a fifth embodiment.
Figure 18B:
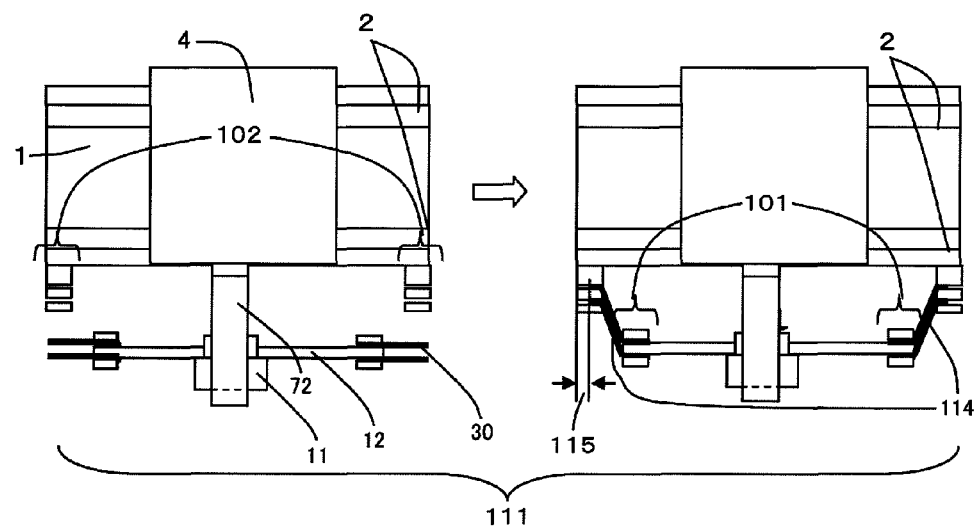
FIG. 18B is a schematic view of a stress producing mechanism during assembly of leaf springs.

Meanwhile, an assembling way B 111 shown in FIG. 18B is such that the coupling members 101 are fixed to the opposite ends of the drive shaft 5 after the actuator body 11 is fixed to the actuator fixing member 72, and then, the base coupling members 102 are finally fixed. At this time, if the leaf springs 6 can have such a structure that the projecting degree thereof can be freely adjusted from the base coupling members 102 through the projecting degree adjustment 115, no tensile force is generated in the leaf springs 30, and accordingly, only a bending force is mainly generated (the leaf spring condition C114). At this stage, considering the characteristics that the leaf springs can readily be deformed in the bending direction thereof, but can hardly be deformed in the pulling direction, it may be said that the assembling way B 111 is desirable for the actuator 10 (piezoelectric element) upon which a resultant forces generated in the leaf springs 10 act. In the fifth embodiment concerns the assembling way B 111 in which the leaf springs 30 have the structure that can freely change their projecting degrees from the respective base coupling members 102, there can be exhibited the technical effects and advantages. With the structure of each base coupling member 102 shown in FIG. 17, there is found no structure (positioning structure) which hampers the leaf spring 30 from being projected, that is, the projecting degree of the leaf spring can be freely adjusted.

It is noted that the necessity of setting the spacer B 106 shown in FIG. 17 can be eliminated during the fastening of the coupling member 101 and the base coupling member 102 if the assembling way B111 is carried out. It is because that the leaf springs 6 are required to be fixed so as to follow the position of the actuator body 11 fixed by the actuator fixing member 72 and the position of the drive shaft 12 which is determined as being guided by the actuator body 11. Thus, with the use of the assembling way B 111 shown in FIG. 18B, the initial stress exerted to the actuator 4 during the assembling thereof can be suppressed.

In view of the fourth and fifth embodiments, the fixing member which fixes the actuator and the movable table to each other, is configured so as to make contact with the actuator at its two surfaces, and accordingly, the guide rails of the stage and the drive shaft of the actuator can be assembled with a high degree of parallelism (the assembling errors in the horizontal direction can be restrained) by a simple assembling way, thereby it is possible to enhance the reliability of the stage positioning device. Further, there can be eliminated the complicated process that the repetitions of loosening and fastening of the actuator body have conventionally required while the 3-D measurements of the assembly is measured with the use of a highly accurate position measuring unit in order to correct for the assembling errors, thereby it is possible to eliminate the man-hours therefor.

Further, in view of the sixth embodiment, from the time when the assembling of the stage positioning device is completed (the time when the actuator is not driven), it is possible to avoid causing the actuator to fall into the condition that a stress is exerted to the actuator.

The above-mentioned several embodiment may be used in combination.

Although the explanation has been made of the several embodiments, the present invention should not be limited to these embodiments, but it can be readily understood by those skilled in the art that the configuration of the present invention may be variously changed or modified without departing the technical concept and scope of the present invention which are stated in the appended claims.

Industrial Applicability

The stage drive device according to the present invention which has been explained hereinabove can be applied to a charge particle beam device such as a scanning electron microscope.

EXPLANATION OF LETTER OR NUMERALS

1 Stage Lower Part (Base)
2 Guide Rail
3 Guide
4 Stage Upper Part (Movable Table)
5 Attachment Portion
6 Actuator Fixing member (L-like Block)
6a Broken Line which indicates Outer Edge of Actuator Fixing Member 6
7 Attachment Portion (for Parallel Leaf Spring)
7a Attachment Lower Part
8 Arrow indicating Travelling Direction of Stage Upper Part (Movable Table)
9 Pressing Spring
0 Actuator
11 Actuator Body 12 Driven Bar (Drive Shaft)
13 Cover
14 Arrow indicating Travelling Direction of Driven Bar (as Actuator Body is fixed)
15 Arrow indicating Travelling Direction of Actuator Body (as Driven Bar is fixed)
16 Linear Drive Actuator having a large degree of freedom in Travelling Direction of Driven bar
17 Front End Part of Piezoelectric Element
18 Arrow indicating Vibrating Direction of Driven Bar (as Actuator Body is fixed)
19 Arrow indicating vibrating direction of Actuator Body (as Driven Bar is fixed)
20 Co-Fastening Portion (for Driven Bar and Parallel Spring)
21 Gripping Portion 1
22, 23, 42 Spacer
24 Gripping Portion 2
30 Leaf Spring (Parallel Leaf Spring)
40 Leaf Spring (Parallel Leaf Spring) Gripping Portion
41, 50 Gripping Portion
51 Stage Heightwise Direction
52 Stage Horizontal Direction A (Longitudinal Direction of Guide Rail 2)
53 Stage Horizontal Direction B (Direction perpendicular to Longitudinal Direction of Guide Rail 2)
60, 70 Leaf Spring
71 Stage
72 Actuator Fixing Member
100 Center Line of Guide Rail
101 Coupling Member
102 Base Coupling Member
103 Drive Shaft Attachment
104 U-Like Member
105 Spacer A
106 Spacer B
107 Base U-like Attachment
108 Attachment Jig
109 Direction of Installation of Attachment Jig
110 Assembling Way A
111 Assembling Way B
112 Leaf Spring Condition A
113 Leaf Spring Condition B
114 Leaf Spring Condition C
115 Projection Degree Adjustment
200 Center Line of Driven Bar
300 Travelling Range of Actuator Body
400a, 400b Deformation Force
500 Broken Line indicting Outer Edge of Driven Bar 12 normally attached
600 Arrow indicating Freedom (Travelling Direction) of Driven Bar
700 Heightwise Center Line of Guide Rail
800 Heightwise Center Line of Driven Bar

The invention claimed is:

1. A stage, comprising:
a movable table on which a sample is carried,
a base on which the movable table is mounted,
an actuator coupled to the movable table, and
a driven member coupled to the base,
wherein the actuator is coupled to the driven member so as to drive the movable table along the driven member, and
wherein the base and the driven member are coupled to each other by a spring mechanism that applies a resilient force in a direction perpendicular to a driving direction of the actuator.

2. A stage as set forth in claim 1, wherein the base and the driven member are coupled to each other through the intermediary of resilient members.

3. A stage as set forth in claim 2, wherein the base and the driven member are connected to each other through the intermediary of at least one leaf spring, and each leaf spring has a surface along the driving direction of the actuator.

4. A stage as set forth in claim 3, wherein the driven member is held at its opposite ends between two leaf springs.

5. A stage as set forth in claim 1, wherein the actuator is a linear drive actuator which has a drive force in parallel with the driven member.

6. A stage as set forth in claim 1, wherein the driven member is moveable in a rotation direction on a surface parallel to a surface in contact with the actuator and the driven member and includes a driving direction of the actuator.

7. A stage as set forth in claim 1, characterized in that the movable table is driven along guide rails laid on the base.

8. A stage as set forth in claim 1, characterized in that the movable table and the actuator are connected to each other through the intermediary of resilient members.

9. A stage as set forth in claim 8, wherein the movable table and the actuator are connected to each other through the intermediary of the leaf springs, the leaf springs each having a surface along the driving direction of the actuator.

10. A stage as set forth in claim 7, characterized in that the movable table and the actuator are connected to each other through the intermediary of an actuator fixing member,
the actuator fixing member has two surfaces which are parallel with the heightwise direction of the stage and the longitudinal direction of the guide rails, respectively, and
the actuator is made into contact with the actuator fixing member at the two surfaces of the latter.

11. A stage as set forth in claim 7, wherein the driven member is fixed to the base through the intermediary of the leaf springs,
a coupling member between the driven member and the leaf springs comprises two driven member attachments which are made into contact with the driven member at two surfaces and face to each other with the driven member being held therebetween, and two U-like members which are arranged so as to embrace the two driven member attachments, and
the leaf springs are held between the driven member attachments and recesses formed in the U-like members.

12. A drive shaft as set forth in claim 11, wherein each of the driven member attachments has two surfaces which are parallel with the heightwise direction of the stage and the longitudinally direction of the driven member, respectively.

13. A method of assembling a stage which comprises a table on which a sample is carried, a base mounted thereon with the movable table, an actuator coupled to the movable table, and a driven member coupled to the base, the method comprising:
connecting the actuator to the driven member through the intermediary of resilient members so as to drive the stage along the driven member,
coupling the driven member and the resilient members after the actuator and the movable table are fixed,
wherein the base and the driven member are coupled to each other by a spring mechanism that applies a resilient force in a direction perpendicular to a driving direction of the actuator.

14. A charge particle beam device for irradiating a charge particle beam onto a sample, including a stage on which the sample is set, the stage comprising:

a movable table on which the sample is carried, a base which is mounted thereon with the movable table, an actuator coupled to the movable table, and a driven member coupled to the base, wherein the actuator is connected to the driven member and drives the stage along the driven member, and wherein the base and the driven member are coupled to each other by a spring mechanism that applies a resilient force in a direction perpendicular to a driving direction of the actuator.

15. A charge particle beam device as set forth in claim 14, wherein the base and the driven member are coupled to each other through the intermediary of resilient members.

16. A charge particle beam device as set forth in claim 15, wherein the base and the driven member are coupled to each other through the intermediary of leaf springs each of which has a surface along the driving direction of the actuator.

17. A charge particle beam device as set forth in claim 14, wherein the actuator is a linear drive actuator with a drive force which is in parallel with the driven member.

* * * * *